(12) United States Patent
Kim et al.

(10) Patent No.: US 11,737,321 B2
(45) Date of Patent: Aug. 22, 2023

(54) DISPLAY APPARATUS AND METHOD OF MANUFACTURING THE SAME

(71) Applicant: Samsung Display Co., Ltd., Yongin-si (KR)

(72) Inventors: Yongseok Kim, Yongin-si (KR); Jaejoong Kwon, Yongin-si (KR); Dongchul Shin, Yongin-si (KR); Kangyoung Lee, Yongin-si (KR); Hyunsup Lee, Yongin-si (KR); Gyehwan Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 300 days.

(21) Appl. No.: 16/988,645

(22) Filed: Aug. 8, 2020

(65) Prior Publication Data

US 2021/0074798 A1 Mar. 11, 2021

(30) Foreign Application Priority Data

Sep. 9, 2019 (KR) .......................... 10-2019-0111558

(51) Int. Cl.
| | |
|---|---|
| *H01L 27/32* | (2006.01) |
| *H10K 59/131* | (2023.01) |
| *H10K 50/844* | (2023.01) |
| *H10K 59/123* | (2023.01) |
| *H10K 71/00* | (2023.01) |

(52) U.S. Cl.
CPC ......... *H10K 59/131* (2023.02); *H10K 50/844* (2023.02); *H10K 59/123* (2023.02); *H10K 71/00* (2023.02)

(58) Field of Classification Search
CPC .... H01L 27/3276; H10K 71/00; H10K 71/50; H10K 71/60; H10K 59/123; H10K 59/131
See application file for complete search history.

(56) References Cited

U.S. PATENT DOCUMENTS

| | | |
|---|---|---|
| 9,293,517 B2 | 3/2016 | Li |
| 10,170,711 B2 | 1/2019 | Sauers et al. |
| 10,217,416 B2 | 2/2019 | Lee et al. |
| 2016/0315044 A1* | 10/2016 | Cheng ................ H01L 23/3135 |
| 2017/0148374 A1 | 5/2017 | Lee et al. |
| 2019/0371707 A1* | 12/2019 | Yueh ..................... H01L 23/481 |

FOREIGN PATENT DOCUMENTS

KR 10-2017-0059523 A 5/2017

* cited by examiner

*Primary Examiner* — Jose R Diaz
(74) *Attorney, Agent, or Firm* — Lewis Roca Rothgerber Christie LLP

(57) ABSTRACT

A display apparatus includes: a substrate including a first surface, a second surface opposite the first surface, a display area defined on the first surface, and a non-display area defined on the second surface; a plurality of display elements at the display area on the first surface of the substrate; a driving circuit on the second surface and overlapping with the display area of the substrate; a first conductive pattern on the second surface of the substrate; and a second conductive pattern on the first surface of the substrate and connected to the first conductive pattern via a contact hole extending through the substrate. A surface roughness of the second surface of the substrate is greater than a surface roughness of the first surface of the substrate.

11 Claims, 20 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2019-0111558, filed on Sep. 9, 2019, in the Korean Intellectual Property Office, the entire disclosure of which is incorporated by reference herein.

BACKGROUND

1. Field

Aspects of one or more embodiments of the present disclosure relate to a display apparatus and a method of manufacturing the same, and more particularly, to a display apparatus including a reduced peripheral area outside (e.g., surrounding around a periphery) of a display area, and a method of manufacturing the display apparatus.

2. Description of Related Art

Generally, display apparatuses operate using a thin-film transistor and display elements, such as organic light-emitting diodes, that are formed on a substrate and emit light. Such display apparatuses may be used in small products, for example, such as cellular phones, and/or the like, or large products, for example, such as televisions (TVs), and/or the like.

Display apparatuses include a display area, in which an image is displayed towards the outside, and a peripheral area outside of the display area. A plurality of pixels are arranged in the display area. A circuit and a wire, each configured to transmit a signal to the plurality of pixels, are arranged in the peripheral area.

Recently, purposes of the display apparatuses have diversified. In addition, as the display apparatuses have become thinner and lighter, the display apparatuses are increasingly widely used. As the display apparatuses are utilized in various fields, research is being briskly conducted to reduce a size of the peripheral area outside the display area.

The above information disclosed in this Background section is for enhancement of understanding of the background of the present disclosure, and therefore, it may contain information that does not constitute prior art.

SUMMARY

One or more example embodiments of the present disclosure may be directed to a display apparatus in which a peripheral area outside (e.g., surrounding around a periphery) of a display area is reduced, and a method of manufacturing the display apparatus.

However, the present disclosure is not limited thereto, and additional aspects and features will be set forth, in part, in the description which follows, and in part, will be apparent from the description, or may be learned by practicing one or more embodiments of the present disclosure.

According to one or more example embodiments of the present disclosure, a display apparatus includes: a substrate including a first surface, a second surface opposite the first surface, a display area defined on the first surface, and a non-display area defined on the second surface; a plurality of display elements at the display area on the first surface of the substrate; a driving circuit on the second surface and overlapping with the display area of the substrate; a first conductive pattern on the second surface of the substrate; and a second conductive pattern on the first surface of the substrate and connected to the first conductive pattern via a contact hole extending through the substrate. A surface roughness of the second surface of the substrate is greater than a surface roughness of the first surface of the substrate.

In an example embodiment, a material component of the first surface may be different from a material component of the second surface.

In an example embodiment, the first conductive pattern may be buried within the substrate.

In an example embodiment, the first conductive pattern may include a surface, another surface opposite the surface, and a side surface extending between the surface and the other surface to connect the surface to the other surface; the surface of the first conductive pattern may be located on a same plane as that of the first surface of the substrate; and the other surface and the side surface of the first conductive pattern may be in direct contact with the substrate.

In an example embodiment, the substrate may include a first base layer and a second base layer on the first base layer, and the display apparatus may further include a connection pattern arranged between the first base layer and the second base layer, and electrically connecting the first conductive pattern to the second conductive pattern.

In an example embodiment, the first conductive pattern may be connected to the connection pattern via a first contact hole in the first base layer, and the connection pattern may be connected to the second conductive pattern via a second contact hole in the second base layer.

In an example embodiment, the display apparatus may further include an electronic structure on the second surface, and electrically connected to the first conductive pattern to overlap with the display area.

In an example embodiment, the display apparatus may further include a plurality of first signal lines extending in a first direction and a plurality of second signal lines extending in a second direction crossing the first direction at the display area, and the second conductive pattern may be connected to the plurality of first signal lines or the plurality of second signal lines.

In an example embodiment, the display apparatus may further include a plurality of pixel circuits at the display area, and connected to the plurality of display elements, respectively, each of the plurality of pixel circuits including: a thin-film transistor including a semiconductor layer, a gate electrode at least partially overlapping with the semiconductor layer, and an electrode layer connected to the semiconductor layer; and a storage capacitor including a lower electrode corresponding to at least a portion of the gate electrode, and an upper electrode on the lower electrode. The second conductive pattern may include a same material as a material of that of at least one selected from among the gate electrode, the electrode layer, the lower electrode, and the upper electrode.

In an example embodiment, the plurality of second signal lines may be electrically connected to the driving circuit via the second conductive pattern.

In an example embodiment, the display apparatus may further include a power supply line on the second surface overlapping with the display area of the substrate.

According to one or more example embodiments of the present disclosure, a display apparatus includes: a substrate including an organic buffer layer, a first base layer on the organic buffer layer, and a second base layer on the first base layer; a plurality of display elements on the second base layer; a first conductive pattern between the organic buffer layer and the first base layer; a connection pattern between the first base layer and the second base layer, and connected to the first conductive pattern via a first contact hole in the first base layer; a second conductive pattern on the second base layer, and connected to the connection pattern via a second contact hole in the second base layer; and an electronic structure electrically connected to the first conductive pattern. The organic buffer layer has an opening exposing at least a portion of the first conductive pattern.

In an example embodiment, the electronic structure may be in direct contact with a first conductive pattern exposed via the opening.

According to one or more example embodiments of the present disclosure, a method of manufacturing a display apparatus, includes: forming an organic buffer layer on a carrier substrate; forming a first conductive pattern on the organic buffer layer; forming a first base layer on the organic buffer layer to cover the first conductive pattern; forming a connection pattern on the first base layer, the connection pattern being connected to the first conductive pattern via a first contact hole extending through the first base layer; forming a display including a plurality of pixel circuits and a plurality of display elements connected to the plurality of pixel circuits, respectively, on the first base layer to overlap with the first conductive pattern; separating the organic buffer layer from the carrier substrate; exposing the first conductive pattern by removing at least a portion of the organic buffer layer; and attaching an electronic structure to the exposed first conductive pattern.

In an example embodiment, before the forming of the display, the method may further include: forming a second base layer on the first base layer to cover the connection pattern; and forming a second conductive pattern on the second base layer, the second conductive pattern being connected to the connection pattern via a second contact hole extending through the second base layer.

In an example embodiment, to expose the first conductive pattern, the method may further include removing an entirety of the organic buffer layer to expose a surface of the first base layer.

In an example embodiment, a surface roughness of a first surface of the first base layer may be greater than a surface roughness of a second surface of the first base layer at an opposite side of the first surface of the first base layer.

In an example embodiment, the first conductive pattern may be buried within the first base layer.

In an example embodiment, an exposed surface of the first conductive pattern may be on a same plane as a plane of the surface of the first base layer.

In an example embodiment, to expose the first conductive pattern, the method may further include forming an opening corresponding to at least a portion of the first conductive pattern in the organic buffer layer.

One or more of the above and other embodiments of the present disclosure may be implemented by using a system, a method, a computer program, or combinations thereof.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1A:
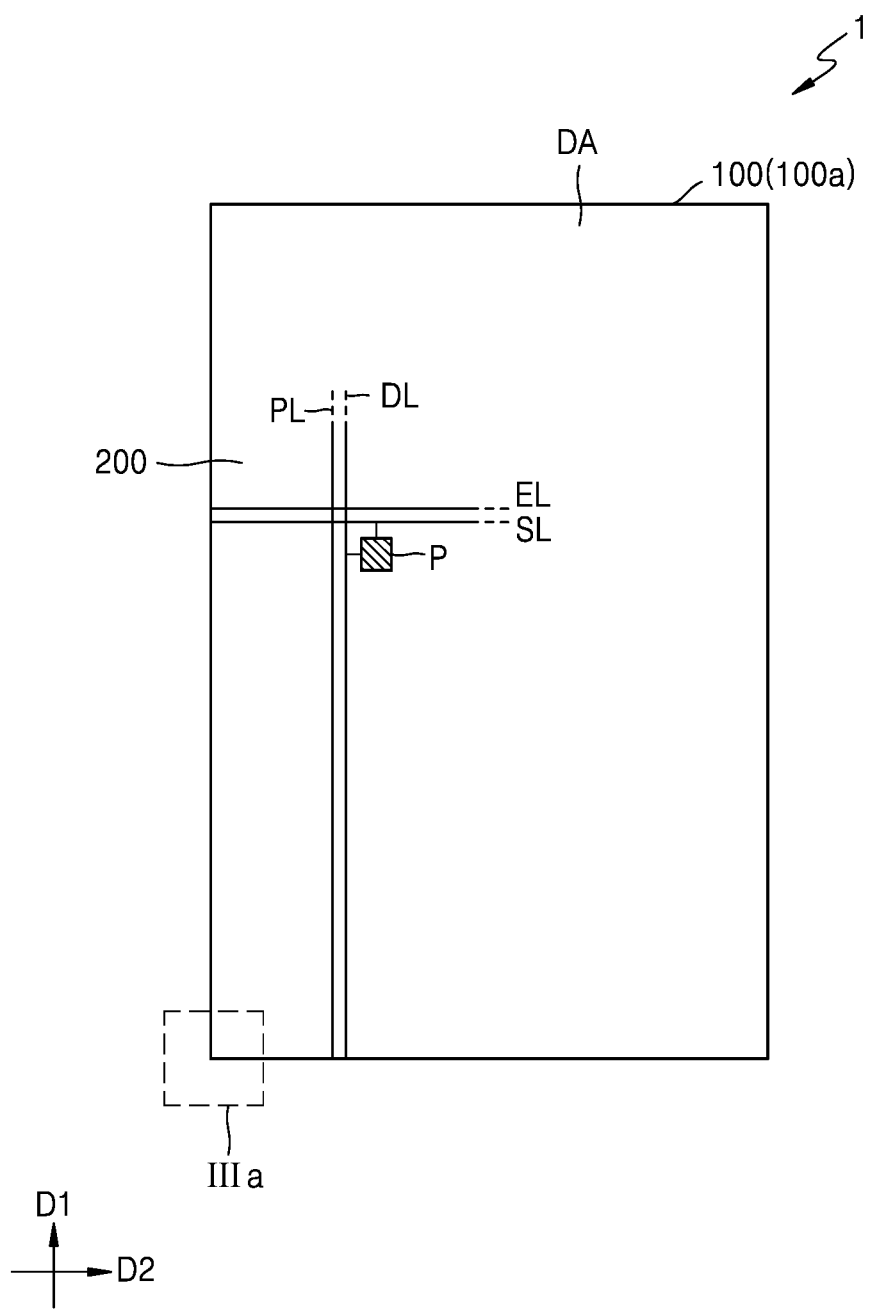
FIG. 1A is a schematic plan view of a front surface of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, region, or component is referred to as being "electrically connected to" or "electrically coupled to" another layer, region, or component, it may be electrically "indirectly connected to" or electrically "indirectly coupled to" the other layer, region, or component, and/or electrically "directly connected to" or electrically "direction coupled to" the other layer, region, or component with one or more intervening elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
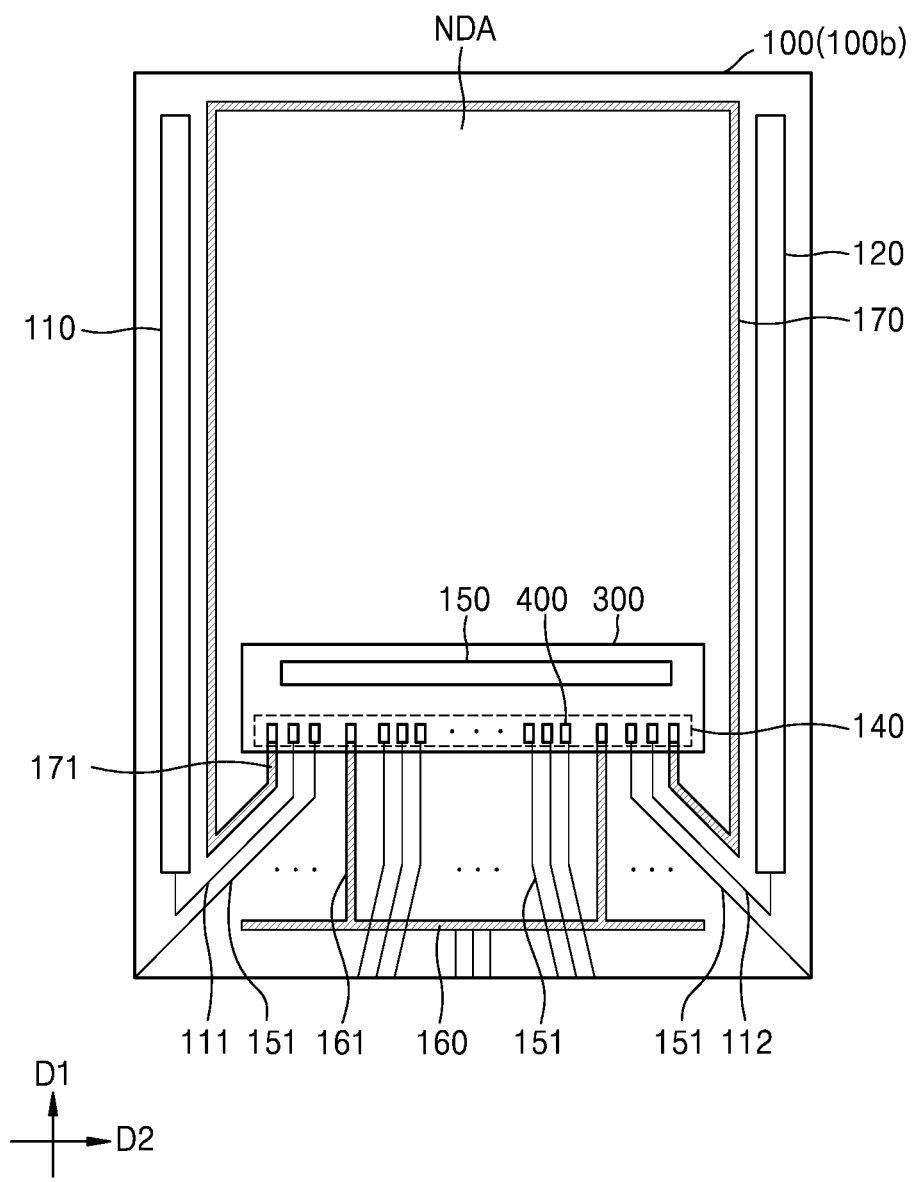
FIG. 1B is a schematic plan view of a rear surface of the display apparatus according to an embodiment.
Figure 2:
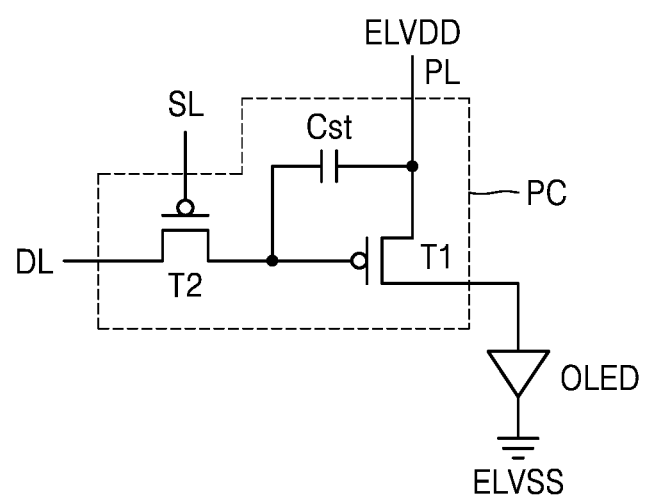
FIG. 2 is an equivalent circuit diagram of a pixel of the display apparatus according to an embodiment.
Figure 3:
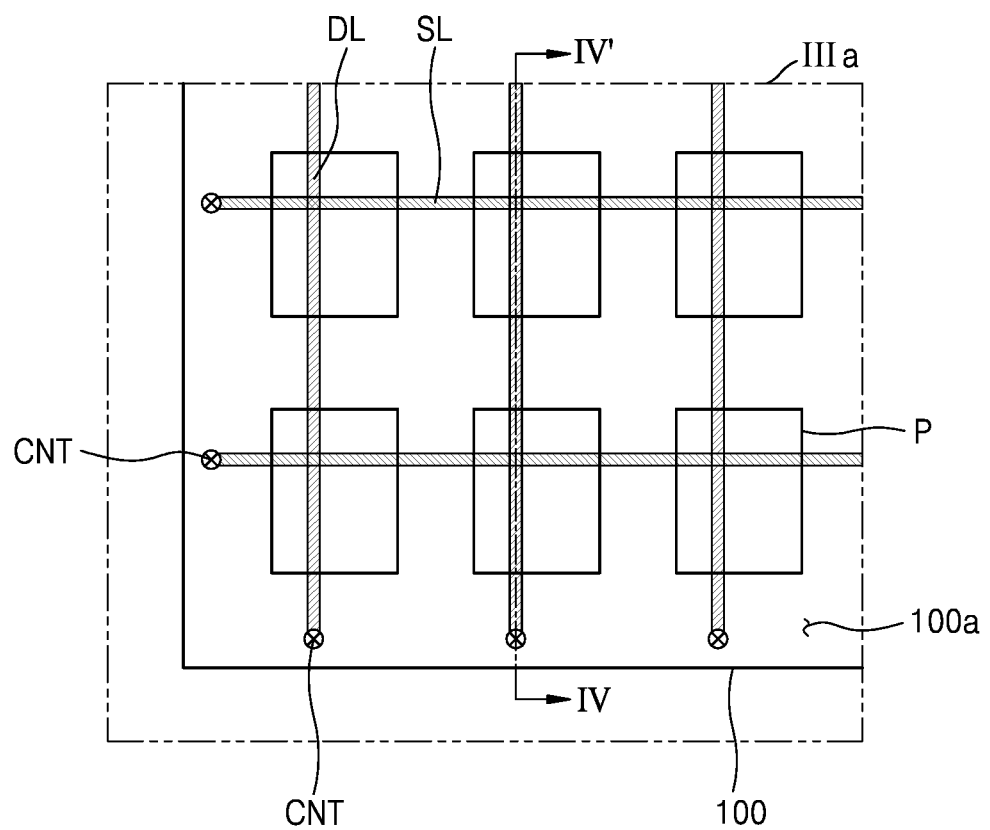
FIG. 3 is an enlarged view of the portion IIIa of FIG. 1A.

FIG. 1A is a schematic plan view of a front surface of a display apparatus 1 according to an embodiment. FIG. 1B is a schematic plan view of a rear surface of the display apparatus 1 according to an embodiment. FIG. 2 is an equivalent circuit diagram of a pixel of the display apparatus 1 according to an embodiment. FIG. 3 is an enlarged view of the portion IIIa of FIG. 1A.

Referring to FIGS. 1A and 1B, a substrate 100 may include a display area DA on a front surface where an image is displayed, and a non-display area NDA on a rear surface where driving circuits configured to display the image and wires connected to the driving circuits are arranged. The display area DA may be defined on a first surface 100a of the substrate 100. The non-display area NDA may be defined on a second surface 100b that is an opposite surface of the first surface 100a. Accordingly, the first surface 100a of the substrate 100 may be understood as a display surface. The second surface 100b of the substrate 100 may be understood as a non-display surface.

The substrate 100 may include various materials, for example, such as glass, metal, plastic, and/or the like. According to an embodiment, the substrate 100 may include a flexible material, such that the substrate 100 may be curvable, bendable, foldable, rollable, and/or the like (e.g., may be easily curved, bent, folded, rolled, and/or the like). The substrate 100 including the flexible material may include, for example, ultra-thin glass, metal, plastic, and/or the like.

A display (e.g., a display panel or a display layer) 200 may be located at (e.g., in or on) the display area of the substrate 100. The display 200 may include a plurality of pixels P including various display elements, for example, such as an organic light-emitting diode OLED. The plurality of the pixels P may be arranged in various forms, for example, such as a stripe arrangement, a pentile arrangement, a mosaic arrangement, and/or the like, to implement an image.

Hereinafter, the display apparatus 1 may be described as an organic light-emitting display apparatus as a representative example according to an embodiment. However, the present disclosure is not limited thereto. For example, in other embodiments, the display apparatus 1 may be any suitable kind of display apparatus, for example, such as an inorganic light-emitting display apparatus (e.g., an inorganic electroluminescent (EL) display apparatus), a quantum-dot light-emitting display apparatus, and/or the like. For example, in various embodiments, an emission layer of a display element in the display apparatus 1 may include an organic material, an inorganic material, a quantum dot, an organic material and a quantum dot, an inorganic material and a quantum dot, and/or the like.

Each of the pixels P may include a display element (e.g., the organic light-emitting diode OLED as shown in FIG. 2) that may emit light having a suitable or desired color (e.g., a predetermined color). The organic light-emitting diode OLED may emit, for example, a red colored light, a green colored light, and/or a blue colored light, or may emit, for example, a red colored light, a green colored light, a blue colored light, and/or a white light. Each of the organic light-emitting diodes OLED may be electrically connected to a pixel circuit PC.

Referring to FIG. 2, the pixel circuit PC may include a first thin-film transistor T1, a second thin-film transistor T2, and a storage capacitor Cst. The second thin-film transistor T2 may be a switching thin-film transistor connected to a scan line SL and a data line DL. The second thin-film transistor T2 may transmit a data voltage input from the data line DL to the first thin-film transistor T1 according to a switching voltage input from the scan line SL. The storage capacitor Cst may be connected to the second thin-film transistor T2 and a driving voltage line PL. The storage capacitor Cst may store a voltage corresponding to a difference between a voltage transmitted from the second thin-film transistor T2 and a first power voltage ELVDD supplied to the driving voltage line PL.

The first thin-film transistor T1 may be a driving thin-film transistor connected to the driving voltage line PL and the storage capacitor Cst. The first thin-film transistor T1 may control a driving current flowing from the driving voltage line PL to the organic light-emitting diode OLED in correspondence with a value of the voltage stored in the storage capacitor Cst. The organic light-emitting diode OLED may emit light having a suitable or desired brightness (e.g., a predetermined brightness) according to the driving current. An opposite electrode (e.g., a cathode) of the organic light-emitting diode OLED may receive a second power voltage ELVSS.

While FIG. 2 illustrates that the pixel circuit PC includes two thin-film transistors and one storage capacitor, the present disclosure is not limited thereto. For example, in other embodiments, the number of thin-film transistors and the number of storage capacitors may be variously modified according to a design (e.g., a structure) of the pixel circuit PC, as would be known to those skilled in the art.

Referring back to FIG. 1A, because the display apparatus 1 according to the present embodiment includes the display area DA on the front surface, a shape of the display area DA in a plan view may correspond to a shape of the substrate 100. As shown in FIG. 1A, the display area DA may have a rectangular shape in the plan view, but the present disclosure is not limited thereto. For example, in other embodiments, the display area DA may have a shape in a plan view corresponding to a circle, a polygon (e.g., such as a triangle, a pentagon, a hexagon, and/or the like) an oval, an irregular shape, and/or the like, according to a shape of the substrate 100.

The display area DA may include a plurality of data lines DL extending in a first direction D1, and a plurality of scan lines SL extending in a second direction D2 crossing the first direction D1. A pixel P located at (e.g., in or on) the display area DA is connected to a corresponding data line DL and a corresponding scan line SL, and may receive a data signal and a scan signal from the corresponding data line DL and the corresponding scan line SL, respectively.

As shown in FIG. 1A, light-emission control lines EL and driving voltage lines PL may be further arranged at (e.g., in or on) the display area DA. For example, the light emission control lines EL may extend in the same or substantially the same direction as that of the scan lines SL, and the driving voltage lines PL may extend in the same or substantially the same direction as that of the data lines DL.

On the first surface 100a of the substrate 100, an inorganic area IRA (e.g., refer to FIG. 11) may be located outside the display area DA. As will be described in more detail below, the inorganic area IRA may be an area at (e.g., in or on) which first and second inorganic encapsulation layers 241 and 243 of a thin-film encapsulation layer 240 meet each other.

The non-display area NDA is located on an opposite surface of the display area DA, and may be an area at (e.g., in or on) which an image is not displayed. Various wires for delivering (e.g., for transferring) an electrical signal to be applied to the display area DA, and a driving circuit may be located at (e.g., in or on) the non-display area NDA.

The display area DA may be provided on the first surface 100a of the substrate 100 as shown in FIG. 1A. In other words, the plurality of pixels P at (e.g., in or on) the display area DA may be arranged on the first surface 100a of the substrate 100. Accordingly, an image implemented via the display area DA may be implemented at (e.g., in or on) the first surface 100a of the substrate 100.

Referring to FIG. 1B, the substrate 100 includes the second surface 100b at an opposite side of the first surface 100a. The second surface 100b may include (e.g., may be) the non-display area NDA at (e.g., in or on) which the driving circuit configured to display an image, and wires connected to the driving circuit may be arranged. A protective film may be on (e.g., may be attached to or connected to) the second surface 100b of the substrate 100.

The driving circuit, for example, such as a first scan driving circuit 110, a second scan driving circuit 120, and a data driving circuit 150, a terminal 140, a first power supply line 160, and a second power supply line 170 may be arranged at (e.g., in or on) the non-display area NDA on the second surface 100b of the substrate 100. However, the present disclosure is not limited thereto, and in another embodiment, the driving circuit configured to display an image and at least some of the wires connected to the driving circuit may be located on the first surface 100a. In the embodiment shown in FIG. 1B, both the driving circuit configured to display an image and the wires connected thereto may be arranged on the second surface 100b of the substrate 100, and an entirety of the first surface 100a may correspond to (e.g., may be) the display area DA.

The first scan driving circuit 110 may provide a scan signal to at least some of the pixels P via corresponding scan lines SL. In some embodiments, the driving circuit may further include a light-emission driving circuit. The light-emission driving circuit may provide a light-emission control signal to each of the pixels P via corresponding light-emission control lines EL.

The second scan driving circuit 120 may be arranged to be spaced apart from, and in parallel with, the first scan driving circuit 110. Some of the pixels P at (e.g., in or on) the display area DA may be electrically connected to the first scan driving circuit 110, and others of the pixels P at (e.g., in or on) the display area DA may be connected to the second scan driving circuit 120. In this case, the pixels P connected to the first scan driving circuit 110 may receive a scan signal from the first scan driving circuit 110, and the pixels P connected to the second scan driving circuit 120 may receive a scan signal from the second scan driving circuit 120. However, the present disclosure is not limited thereto, for example, in another embodiment, the second scan driving circuit 120 may be omitted. In this case, each of the pixels P may receive a scan signal from the first scan driving circuit 110 via corresponding scan lines SL.

In the present embodiment, as will be described in more detail below with reference to at least FIG. 3, a scan line SL located on the first surface 100a of the substrate 100 may be electrically connected to the first scan driving circuit 110 or the second scan driving circuit 120 via a contact hole CNT (e.g., refer to FIG. 3) extending (e.g., passing) through the substrate 100.

The terminal 140 may be arranged on the second surface 100*b* of the substrate 100. The terminal 140 may not be covered by an insulating layer, and may be exposed (e.g., to be electrically connected to an electronic structure 300). The electronic structure 300 may be implemented as (e.g., may have a form of) an integrated circuit (IC) or a flexible printed circuit board (FPCB). For convenience, FIG. 1B illustrates that the electronic structure 300 is implemented as an FPCB, but the present disclosure is not limited thereto. When the electronic structure 300 is implemented as an FPCB, a terminal of the FPCB may be electrically connected to the terminal 140 of the display apparatus 1. In an embodiment, the FPCB may transmit a signal or a power of a controller to the display apparatus 1. A control signal generated from the controller may be transmitted to the first and second scan driving circuits 110 and 120 via connection wires 111 and 112, respectively.

The data driving circuit 150 is electrically connected to the data lines DL. A data signal of the data driving circuit 150 may be provided to each of the pixels P via corresponding data lines DL that are connected to connection wires 151 connected to the terminal 140. FIG. 1B illustrates that the data driving circuit 150 is arranged on a printed circuit substrate. However, the present disclosure is not limited thereto, and in another embodiment, the data driving circuit 150 may be arranged on the substrate 100. For example, the data driving circuit 150 may be arranged between the terminal 140 and the first power supply line 160.

The first power supply line 160 and the second power supply line 170 may provide the first and second power voltages ELVDD and ELVSS (e.g., refer to FIG. 2) to each of the pixels P via connection wires 161 and 171. The first power voltage ELVDD may be provided to each of the pixels P via the driving voltage line PL connected to the first power supply line 160. The second power voltage ELVSS may be provided to an opposite electrode 223 (e.g., refer to FIG. 9) of a pixel P connected to the second power supply line 170. As an example, the second power supply line 170 may be provided to have a loop shape with an open side.

The terminal 140 on the second surface 100*b* of the substrate 100 may include a plurality of pads 400 (hereinafter, which may be referred to as a first conductive pattern). The plurality of pads 400 may be arranged adjacent to each other, and may be spaced apart from each other. Each of the pads 400 may be a component electrically connected to the electronic structure 300, which may be an FPCB, an integrated circuit (IC) chip, and/or the like configured to drive and/or control the display apparatus 1. Each of the pads 400 may include a conductive material.

In an example embodiment, the pads 400 on the second surface 100*b* of the substrate 100 may be electrically connected to a plurality of wires (e.g., the data lines DL) included at (e.g., in or on) the display 200 on the first surface 100*a* of the substrate 100.

Referring to FIG. 3, the plurality of data lines DL on the first surface 100*a* may be electrically connected to the plurality of pads 400 on the second surface 100*b* via the contact hole CNT extending (e.g., passing) through the substrate 100. In this case, the plurality of data lines DL (e.g., each of the plurality of data lines DL) may be directly connected to the plurality of pads 400. However, the present disclosure is not limited thereto, and in another embodiment, the plurality of data lines DL (e.g., each of the plurality of data lines DL) may be connected to the plurality of pads 400 via a conductive layer that may be formed by using a separate process.

In addition, the plurality of scan lines SL on the first surface 100*a* may be electrically connected to the first scan driving circuit 110 or the second scan driving circuit 120 on the second surface 100*b* via the contact holes CNT extending (e.g., passing) through the substrate 100.

According to one or more example embodiments, to implement a full display on an entire surface or substantially an entire surface of the display apparatus 1, an entire surface (e.g., the first surface 100*a* or the front surface) or substantially the entire surface thereof may correspond to (e.g., may be) the display area DA at (e.g., in or on) which an image is displayed. In this case, the display apparatus 1 may not include a non-display area (e.g., a peripheral area or a bezel area) that surrounds (e.g., around a periphery of) the display area DA (or may include a substantially reduced or minimized non-display area that surrounds around a periphery the display area DA). For example, when the driving circuits configured to display an image and the wires connected to the driving circuits are arranged on the second surface 100*b* (e.g., the rear surface) of the substrate 100, and the driving circuits and the wires connected thereto are electrically connected to the wires of the display 200 located on the first surface 100*a* (e.g., the front surface) via the contact holes CNT extending (e.g., passing) through the substrate 100, an entirety or substantially an entirety of the first surface 100*a* (e.g., the front surface) may be implemented as the display area DA.

Figure 4:
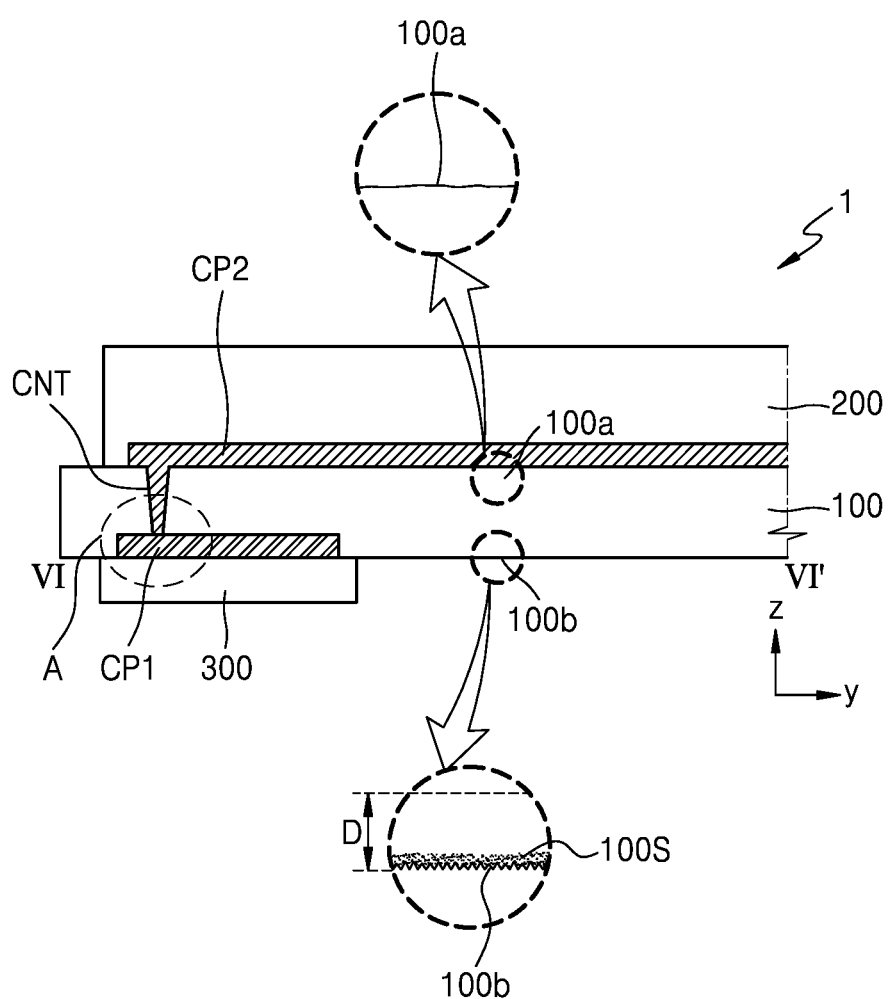
FIG. 4 is a schematic cross-sectional view of a portion of the display apparatus according to an embodiment.
Figure 5:
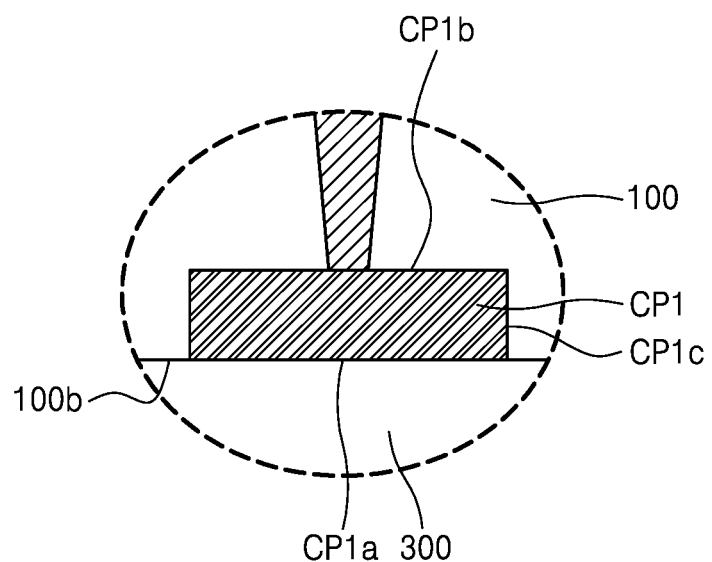
FIG. 5 is a schematic enlarged view of the portion A of FIG. 4.

FIG. 4 is a schematic cross-sectional view of a portion of the display apparatus 1 according to an embodiment. For example, FIG. 4 may illustrate an example cross-sectional view of the display apparatus 1 taken along the line IV-IV' of FIG. 3. FIG. 5 is a schematic enlarged view of the portion A of FIG. 4.

Referring to FIG. 4, the substrate 100 includes the first surface 100*a* and the second surface 100*b* at an opposite side from that of the first surface 100*a*. The display 200 may be located on the first surface 100*a* corresponding to the display area DA. As shown in FIG. 1A, the display 200 may include the plurality of pixels P. A detailed configuration of the display 200 will be described in more detail below with reference to FIG. 9.

A first conductive pattern CP1 (e.g., the plurality of pads 400 described above) may be located at (e.g., in or on) the second surface 100*b* of the substrate 100. As shown in FIG. 4, the first conductive pattern CP1 may be arranged to overlap with the display 200 located at (e.g., in or on) the display area DA.

In some embodiments, the first conductive pattern CP1 may be located within the second surface 100*b*, such that at least a portion of the first conductive pattern CP1 may be exposed to the outside via the second surface 100*b*. This is structurally different from a first conductive pattern CP1 that is located on the second surface 100*b*. For example, the first conductive pattern CP1 in the embodiment shown in FIG. 4 may be buried within the substrate 100, and thus, a surface of the first conductive pattern CP1 may be exposed to outside via the second surface 100*b*. Also, a side surface of the first conductive pattern CP1 may not be exposed to outside via the second surface 100*b*.

For example, referring to FIG. 5, which illustrates an enlarged view of the first conductive pattern CP1, the first conductive pattern CP1 includes a surface (e.g., a bottom surface) CP1*a*, another surface (e.g., a top surface) CP1*b* at an opposite side from that of the surface CP1*a*, and side surfaces CP1c that extend between the surfaces CP1a and CP1b (e.g., that connect the bottom surface CP1a to the top surface CP1b). As described above, the first conductive pattern CP1 may be provided to be buried within the substrate 100. In other words, the other surface CP1b and the side surfaces CP1c of the first conductive pattern CP1 may be in direct contact with the substrate 100, and the surface CP1a of the first conductive pattern CP1 may be exposed to the outside via the second surface 100b of the substrate 100.

Figure 8A:
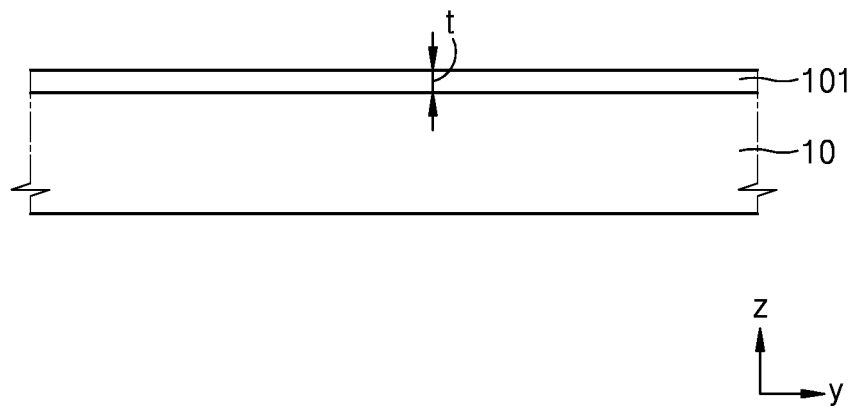
FIGS. 8A-8G are schematic cross-sectional views illustrating various operations of a method of manufacturing the display apparatus according to an embodiment.
Figure 8B:
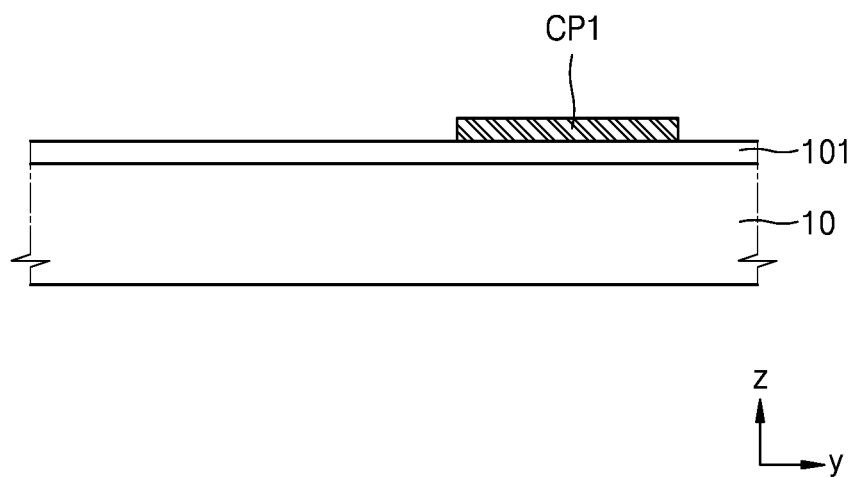
Figure 8C:
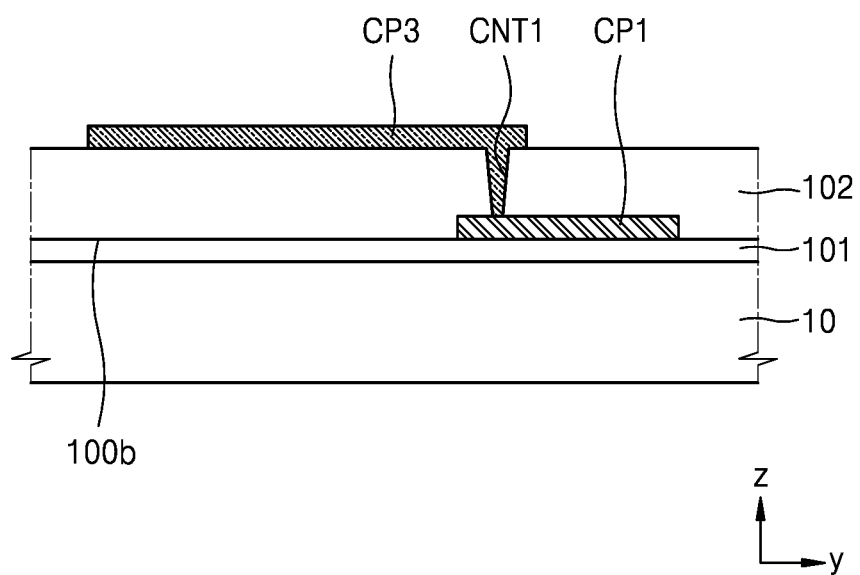

In an embodiment, the surface CP1a of the first conductive pattern CP1 may be located on a same plane as that of the second surface 100b of the substrate 100. Such a structure may result from a method of manufacturing the display apparatus 1 according to an embodiment. For example, during a manufacturing process according to an embodiment, because both the surface CP1a of the first conductive pattern CP1 and the second surface 100b of the substrate 100 may be arranged on an organic buffer layer 101 (e.g., as shown in FIGS. 8A to 8C), after the organic buffer layer 101 is removed, remaining portions of the surface CP1a of the first conductive pattern CP1 and the second surface 100b of the substrate 100 may be on the same plane as each other.

Referring back to FIG. 4, during an etching process in which the organic buffer layer 101 is removed, for example, such as an ashing process and/or a dry-etching process, the second surface 100b of the substrate 100 may be irregularly damaged. For example, as shown in the enlarged portions of the first and second surfaces 100a and 100b of FIG. 4, surface roughness of the second surface 100b of the substrate 100, which may result from the process of removing the organic buffer layer 101, may be greater than surface roughness of the first surface 100a of the substrate 100, on which the process is not performed. In other words, the second surface 100b may be formed to be more irregular and rougher than the first surface 100a.

In addition, a material component 100S of the second surface 100b of the substrate 100 that may react to an etching gas in the process of removing the organic buffer layer 101 may be different from a material component of the first surface 100a of the substrate 100. Characteristics of the material component 100S may be checked via a component analysis of a surface of the substrate 100. For example, the material component 100S of the second surface 100b of the substrate 100 may be an etching gas component that partially remains after the second surface 100b reacts to the etching gas. The material component 100S of the second surface 100b may be different from a material component of the substrate 100 at a depth (e.g., a particular depth or a certain depth) D of the substrate 100 from the second surface 100b. In an embodiment, the material component 100S of the second surface 100b may be variously modified according to the kind or type of the etching gas used, and thus, the present disclosure is not limited to a particular element or compound for the material component 100S. In this case, the material component 100S of the second surface 100b may be a component that is not initially included in a material of the substrate 100.

The second conductive pattern CP2 may be arranged on the first surface 100a of the substrate 100. In an embodiment, the second conductive pattern CP2 may be a line (e.g., a data line DL) included at (e.g., in or on) the display 200 and extending on (e.g., extending across) the display 200. In another embodiment, the second conductive pattern CP2 may be a separate conductive layer that is electrically connected to the line (e.g., the data line DL). The second conductive pattern CP2 may be connected to the first conductive pattern CP1 via the contact hole CNT extending (e.g., passing) through the substrate 100.

The electronic structure 300 (e.g., the FPCB or the IC chip) that is connected to the second conductive pattern CP2 may be arranged on the second surface 100b of the substrate 100. In a comparative example, when the pads and the electronic structure are arranged on a front surface (e.g., a first surface) of the substrate, an area at (e.g., in or on) which the pads and the electronic structure are located may be provided as a non-display area. In this case, there may be a limit to implementing a full display. For example, in the comparative example, the non-display area may be adjacent to the display area at the front surface (e.g., the first surface), and thus, an entirety of the front surface may not be implemented as the display area. On the other hand, in an embodiment, because the first conductive pattern CP1 is arranged on a rear surface (e.g., the second surface 100b) of the substrate 100, the electronic structure 300 may be arranged directly on the rear surface (e.g., the second surface 100b) of the substrate 100. Thus, a peripheral area PA, for example, a non-display area NDA, that is outside (e.g., that is adjacent to) the display area DA may be remarkably reduced.

Figure 6:
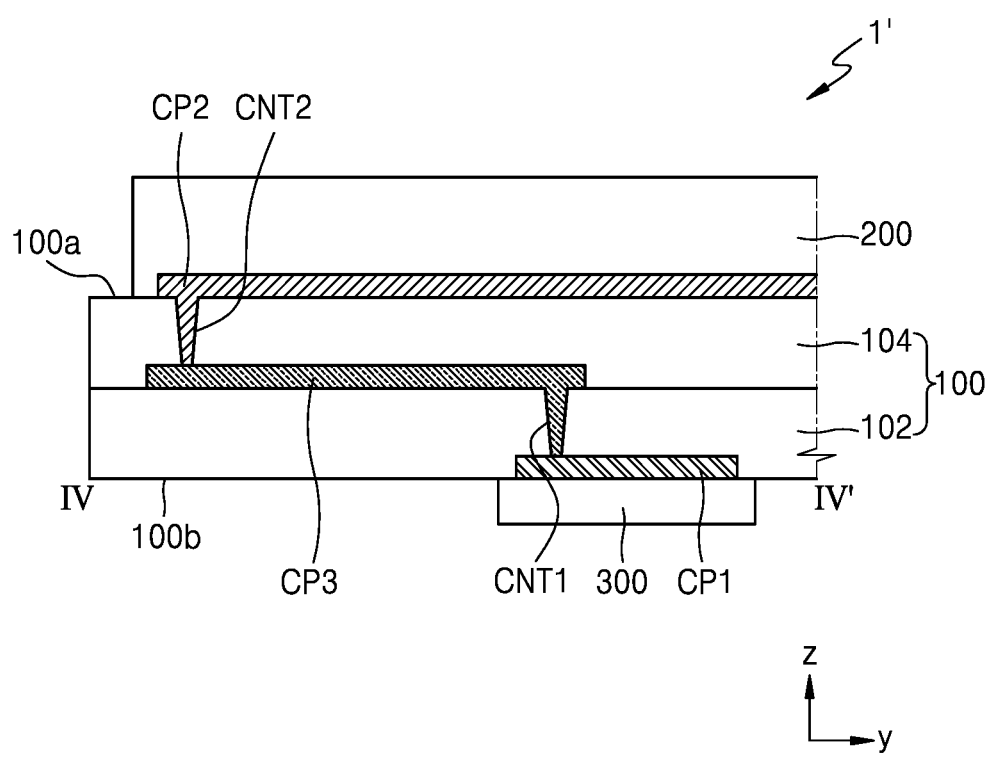
FIGS. 6-7 are schematic cross-sectional views of a portion of the display apparatus according to one or more embodiments.
Figure 7:
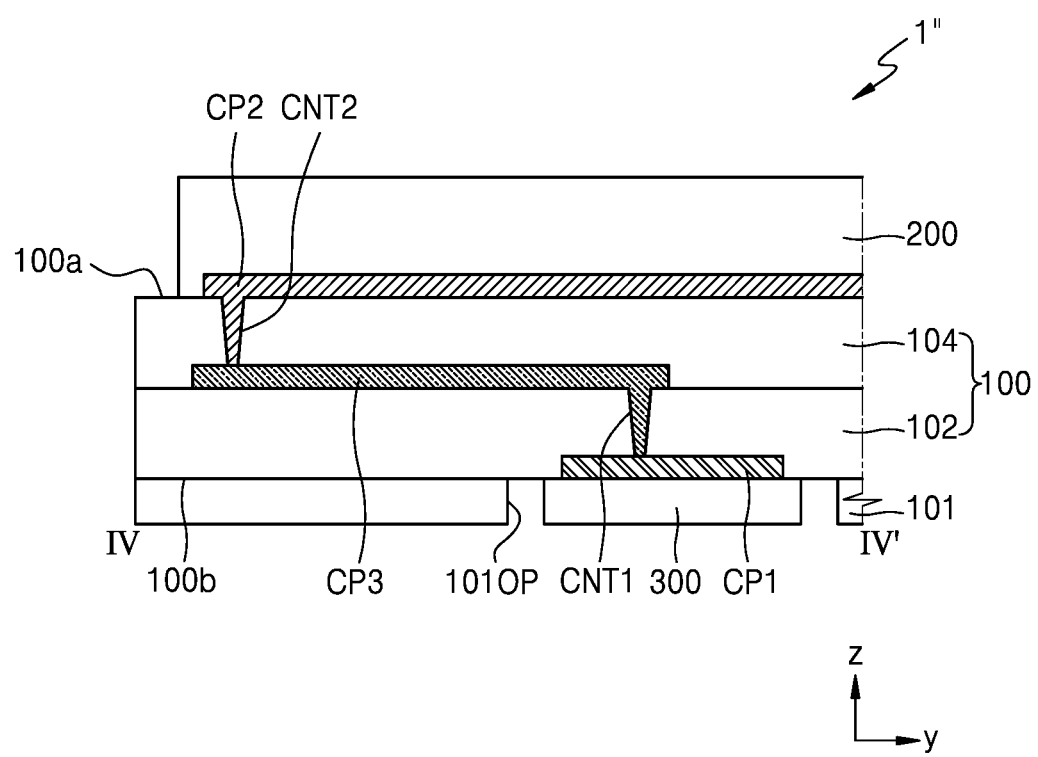

FIGS. 6 and 7 are schematic cross-sectional views of a portion of a display apparatus according to one or more embodiments. For example, FIGS. 6 and 7 may illustrate example cross-sectional views of the display apparatus 1 taken along the line IV-IV' of FIG. 3.

The substrate 100 of the display apparatuses 1' and 1" shown in FIGS. 6 and 7, respectively, may be provided to have a multi-layered structure. FIGS. 6 and 7 illustrate a dual-layered structure in which the substrate 100 includes a first base layer 102 and a second base layer 104. However, the present disclosure is not limited thereto, and in other embodiments, the substrate 100 may include a structure including three or more layers.

Referring to FIG. 6, the substrate 100 may include the first base layer 102 and the second base layer 104 that are sequentially stacked. The first conductive pattern CP1 may be located on the second surface 100b (e.g., a surface of the first base layer 102) of the substrate 100. A connection pattern CP3 may be located between the first base layer 102 and the second base layer 104. The second conductive pattern CP2 may be located on the first surface 100a (e.g., a surface of the second base layer 104) of the substrate 100. The connection pattern CP3 may be connected to the first conductive pattern CP1 via a first contact hole CNT1 extending (e.g., passing) through the first base layer 102. The second conductive pattern CP2 may be connected to the connection pattern CP3 via a second contact hole CNT2 extending (e.g., passing) through the second base layer 104.

The first conductive pattern CP1 may be exposed to the outside via the second surface 100b of the substrate 100. The electronic structure 300 may be electrically connected to the exposed first conductive pattern CP1 as described above.

Referring to FIG. 7, the first conductive pattern CP1 may be exposed to the outside via the second surface 100b of the substrate 100, and may be exposed to the outside via an opening 101OP in the organic buffer layer 101, which may be provided to be in contact with the second surface 100b of the substrate 100. In this case, due to a height difference at (e.g., in or on) the opening 101OP, the electronic structure 300 may be electrically connected to the first conductive pattern CP1 via a conductive material layer 310 (e.g., see FIG. 11), for example, such as a bump.

Hereinafter, a method of manufacturing the display apparatus 1 according to an embodiment is described in more detail with reference to FIGS. 8A to 8G.

FIGS. 8A to 8G are schematic cross-sectional views illustrating various operations of the method of manufacturing the display apparatus according to an embodiment. The manufacturing method described with reference to FIGS. 8A to 8G may correspond to the display apparatus 1' of FIG. 6.

Referring to FIG. 8A, the organic buffer layer 101 may be formed on a carrier substrate 10. The carrier substrate 10 may be divided into the display area DA (e.g., a first surface 100a or a front surface) at (e.g., in or on) which a plurality of pixels are to be arranged, and the peripheral area PA (e.g., a second surface 100b or a rear surface) at (e.g., in or on) an outer portion thereof. The organic buffer layer 101, and the first base layer 102 and the second base layer 104, which will be described in more detail below, may form a structure constituting at least a portion of the substrate 100. The organic buffer layer 101, the first base layer 102, and the second base layer 104 may be formed on an entire surface of the carrier substrate 10.

The organic buffer layer 101 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate.

In an embodiment, a thickness t of the organic buffer layer 100 may be less than (e.g., may be smaller than) thicknesses of the first base layer 102 and the second base layer 104, because a part or a whole portion of the organic buffer layer 101 may be removed during a manufacturing process. The thickness t of the organic buffer layer 101 may be within a range of several micro-meters (μm). For example, in an embodiment, the thickness t of the organic buffer layer 101 may be formed in a range from about 0.5 μm to about 2 μm.

As shown in FIG. 8B, the first conductive pattern CP1 may be formed on the organic buffer layer 101. The first conductive pattern CP1 may refer to pads to which a module such as the electronic structure 300 is connected. FIG. 8B illustrates a structure in which the first conductive pattern CP1 is arranged at (e.g., in or on) the peripheral area PA (e.g., the second surface 100b or the rear surface). However, in another embodiment, the first conductive pattern CP1 may be arranged at (e.g., in or on) the display area DA (e.g., the first surface 100a or the front surface). The first conductive pattern CP1 may include, for example, at least one selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), and copper (Cu), in consideration of a conductivity thereof. The first conductive pattern CP1 may include a single layer or multiple layers.

The first base layer 102 may be formed on the first conductive pattern CP1, as shown in FIG. 8C. The first base layer 102 may be formed on an entire surface of the carrier substrate 10 to cover the first conductive pattern CP1.

The connection pattern CP3 may be formed on the first base layer 102. The connection pattern CP3 may be connected to the first conductive pattern CP1 via the first contact hole CNT1 in the first base layer 102. Before the connection pattern CP3 is formed, the first contact hole CNT1 may be patterned to extend (e.g., to pass) through the first base layer 102 so that a portion of the first conductive pattern CP1 is exposed to the outside.

The connection pattern CP3 may be a structure configured to electrically connect the first conductive pattern CP1 to the second conductive pattern CP2, which will be described in more detail below. The connection pattern CP3 may include various suitable shapes in a plan view. In an embodiment, the connection pattern CP3 may include a plurality of conductive lines. The plurality of conductive lines may have a fan-out shape in a plan view or in a cross-sectional view. The connection pattern CP3 may include, for example, at least one selected from among Al, Pt, Pd, Ag, Mg, Au, Ni, Nd, Ir, Cr, Li, Ca, Mo, and Cu, in consideration of a conductivity thereof. The connection pattern CP3 may include a single layer or multiple layers.

Figure 8D:
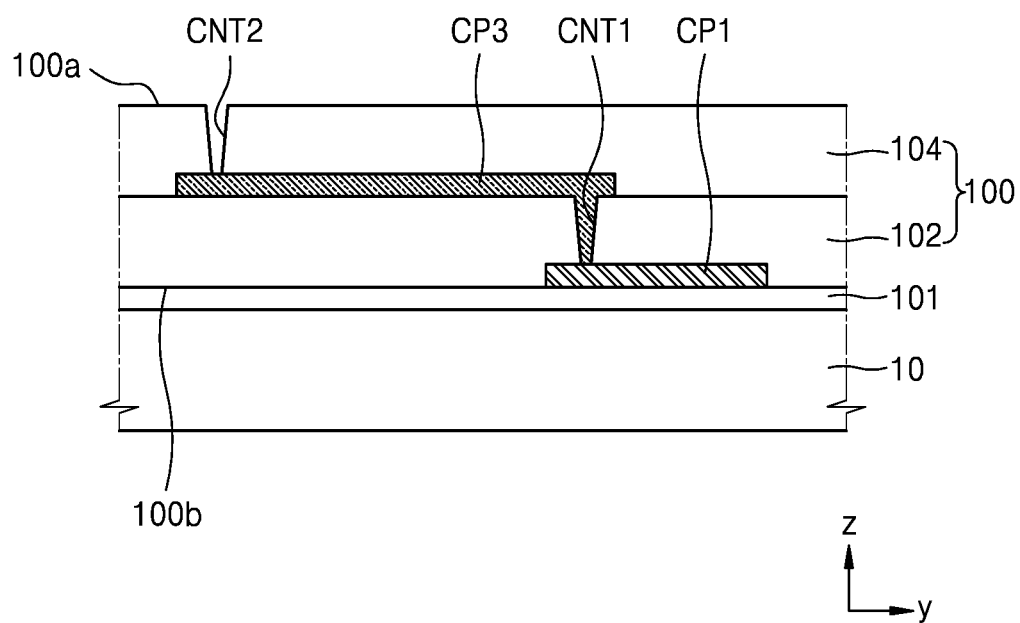

As shown in FIG. 8D, the second base layer 104 may be formed on the connection pattern CP3. The second base layer 104 may be arranged to cover the connection pattern CP3.

The first base layer 102 and the second base layer 104 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The first base layer 102 and the second base layer 104 may include the same or substantially the same material as each other, but the present disclosure is not limited thereto. For example, in another embodiment, the first base layer 102 and the second base layer 104 may include different materials from each other.

The second contact hole CNT2 may be formed in the second base layer 104 to expose a portion of the connection pattern CP3.

The first base layer 102 and the second layer 104 may form at least a portion of the substrate 100. In some embodiments, an inorganic buffer layer may be arranged between the first base layer 102 and the second base layer 104.

Figure 9:
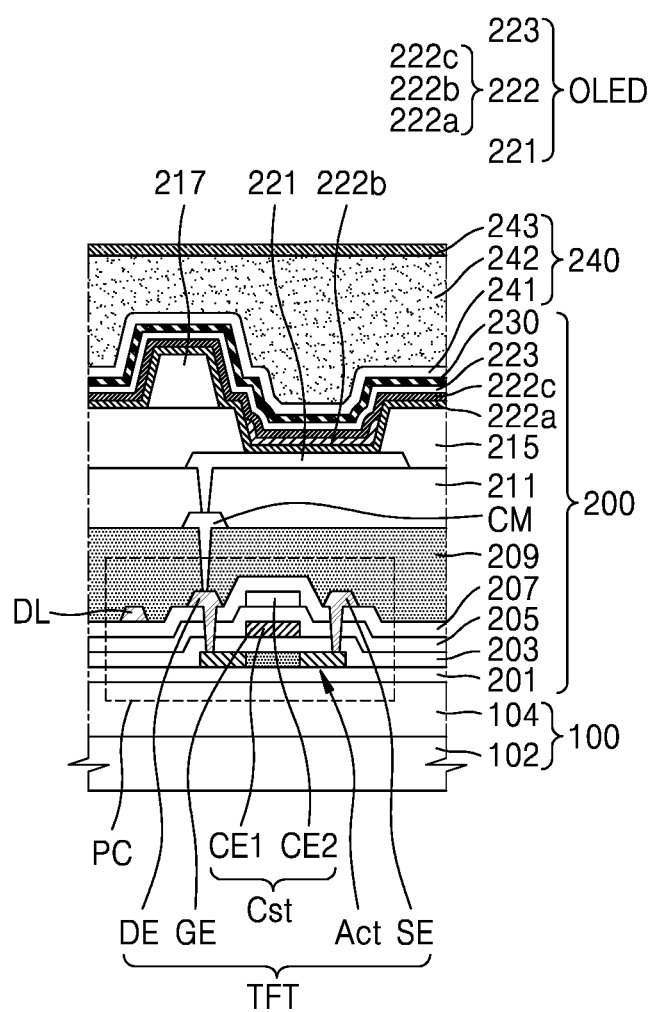
FIGS. 9-12 are schematic cross-sectional views of a portion of the display apparatus according to one or more embodiments.

The second conductive pattern CP2 may be formed on the second base layer 104. The second conductive pattern CP2 may be formed by using the same or substantially the same process as that of one of the conductive layers including a conductive material included at (e.g., in or on) the display 200. For example, in an embodiment, the second conductive pattern CP2 may include the same or substantially the same material as that of a gate electrode GE of the thin-film transistor TFT, or as that of an upper electrode CE2 of the storage capacitor Cst, which are shown in FIG. 9. The second conductive pattern CP2 may include, for example, at least one selected from among Al, Pt, Pd, Ag, Mg, Au, Ni, Nd, Ir, Cr, Li, Ca, Mo, and Cu, in consideration of a conductivity thereof. The second conductive pattern CP2 may include a single layer or multiple layers.

Figure 8E:
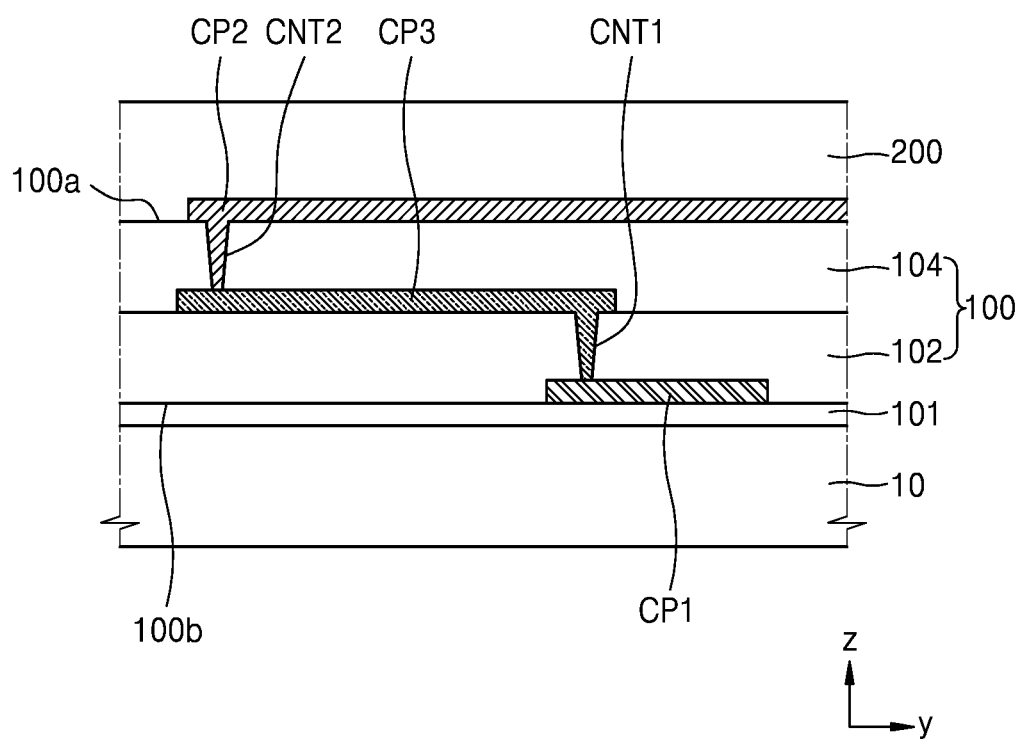

The display 200 may be formed at (e.g., in or on) the display area DA (e.g., the first surface 100a or the front surface) of the second base layer 104, as shown in FIG. 8E. For example, the display 200 may be formed on the second base layer 104 to cover the second conductive pattern CP2. For convenience, a stacked structure of the display 200 is not illustrated in FIG. 8E. However, the display 200 may include a structure formed by stacking and patterning at least one inorganic layer including an inorganic insulating material, at least one organic layer including an organic insulating material, and at least one conductive layer including a conductive material. The display 200 may include the pixel circuit PC including a thin-film transistor and a storage capacitor, and a display element, for example, such as an organic light-emitting diode OLED, electrically connected to the pixel circuit PC. A structure of the display 200 may be described in more detail below with reference to FIG. 9.

Figure 8F:
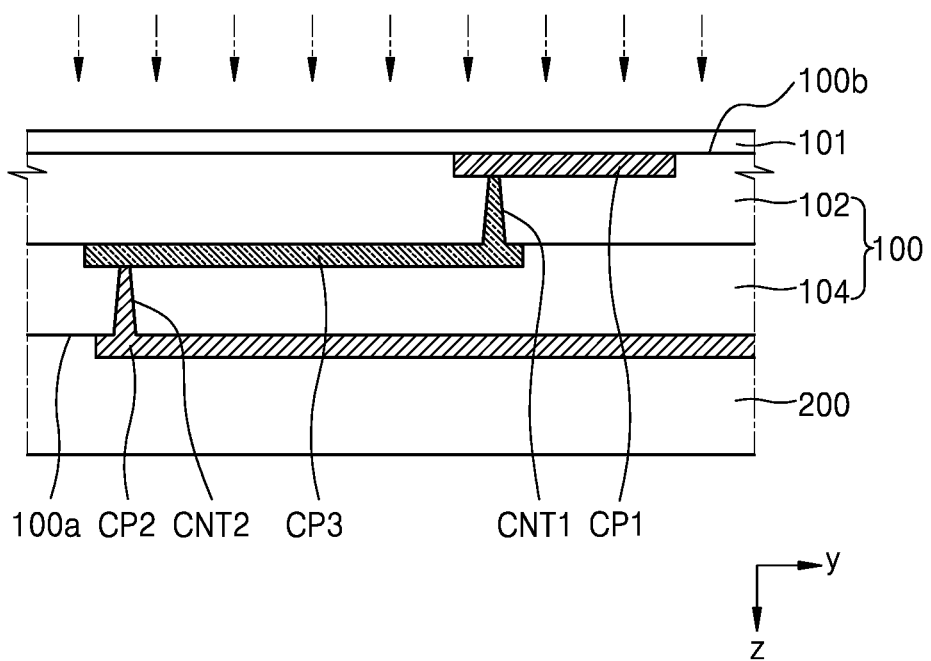
Figure 8G:
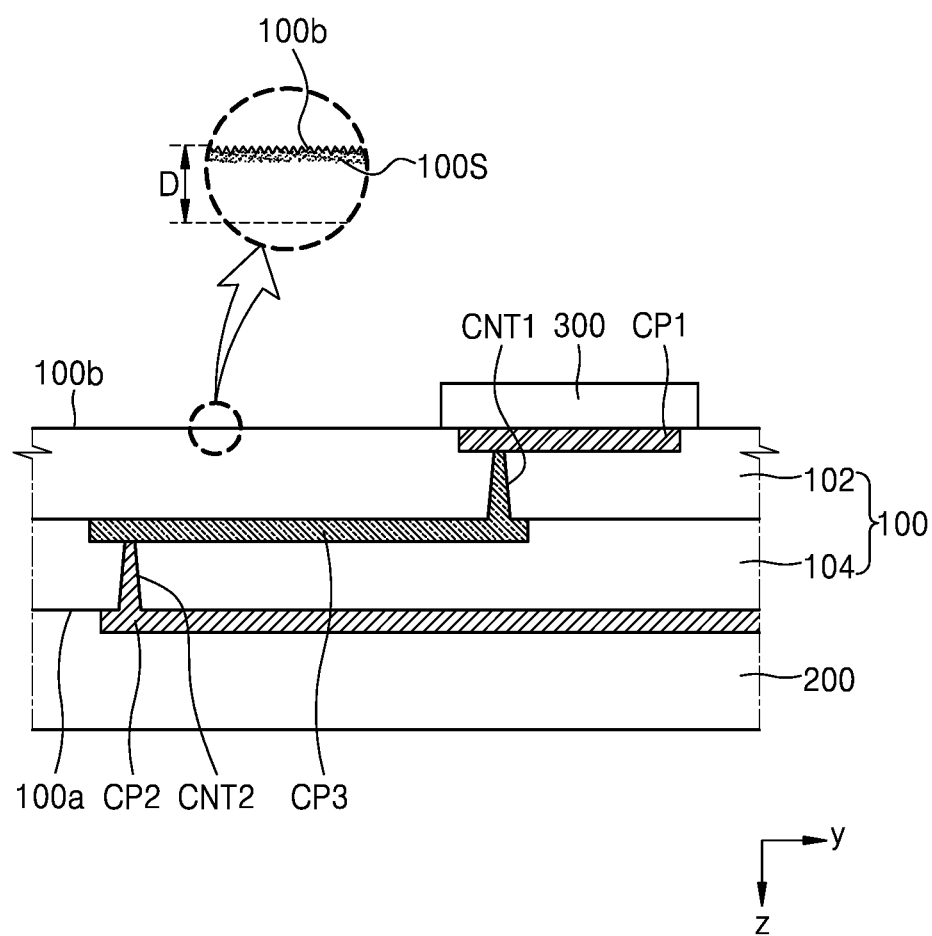

After the display 200 is formed (or after the second conductive pattern CP2 is formed), the carrier substrate 10 may be separated (e.g., may be removed). After the carrier substrate 10 is separated, a process of etching the organic buffer layer 101 may be performed as shown in FIG. 8F. For example, an ashing and/or dry etching method may be used as the etching process. In various embodiments, a portion (e.g., a part) or an entirety (e.g., a whole) of the organic buffer layer 100 may be removed. For example, as shown in FIG. 8G, in an embodiment, an entirety of the organic buffer layer 101 may be removed. In another example, in an embodiment, when a portion of the organic buffer layer 101 is removed, the opening 101OP (e.g., see FIG. 7) exposing the first conductive pattern CP1 may be formed in the organic buffer layer 101.

FIG. 8G illustrates a structure obtained after an entirety of the organic buffer layer 101 is removed. Referring to the enlarged view of the second surface 100b in FIG. 8G, as a result of removing the organic buffer layer 101 by the etching process, the second surface 100b of the substrate 100 may have a surface roughness. The surface roughness of the second surface 100b of the substrate 100 may be greater than a surface roughness of the first surface 100a of the substrate 100 on which the etching process is not performed. In other words, the second surface 100b may be formed to be more irregular and rougher than the first surface 100a. In an embodiment, the surface roughness of the second surface 100b of the substrate 100 may be greater than a surface roughness of an opposite surface of the first base layer 102. In an embodiment, the second surface 100b of the substrate 100 may mean one surface of the first base layer 102 located on the back surface of the substrate 100, and the first surface 100a of the substrate 100 may mean one surface of the second base layer 104 located on the upper surface of the substrate 100. However, the first surface 100a of the substrate 100 may mean the other surface of the first base layer 102 disposed of facing the second base layer 104.

In addition, the material component 100S of the second surface 100b of the substrate 100 that is used to react to the etching gas in the etching process may be different from a material component of the first surface 100a of the substrate 100. Characteristics of the material component 100S may be checked from a component analysis of a surface of the substrate 100. For example, the material component 100S of the second surface 100b of the substrate 100 may be an etching gas component that may partially remain after the second surface 100b reacted to the etching gas. The material component 100S of the second surface 100b may be different from a material component of the substrate 100 at a depth (e.g., a particular depth) D of the substrate 100 from the second surface 100b. The material component 100S of the second surface 100b is not limited to a particular element or compound, and may be variously modified according to etching gas used. In this case, the material component 100S of the second surface 100b may be a component that is not initially included in a material of the substrate 100.

The first conductive pattern CP1, which may be exposed in a direction towards the second surface 100b of the substrate 100 through the manufacturing process described above, may be electrically connected to the electronic structure 300.

Figure 10:
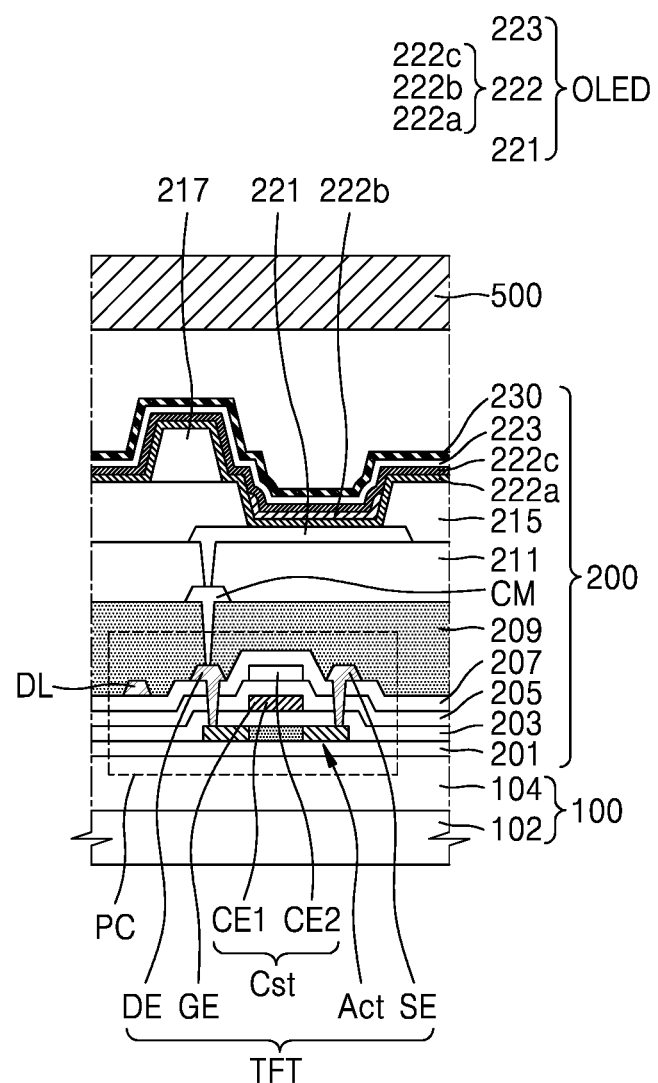

FIGS. 9 and 10 are schematic cross-sectional views of a portion of the display apparatus according to one or more embodiments.

Referring to FIG. 9, a buffer layer 201 may be arranged on the substrate 100. The buffer layer 201 may be formed to prevent or substantially prevent penetration of impurities into a semiconductor layer Act of the thin-film transistor TFT. The buffer layer 201 may include an inorganic insulating layer, for example, such as silicon nitride, silicon oxynitride, or silicon oxide. The buffer layer 201 may include a single layer structure or a multiple layered structure including one or more of the inorganic insulating materials described above.

The pixel circuit PC may be arranged on the buffer layer 201. The pixel circuit PC includes the thin-film transistor TFT and the storage capacitor Cst. The thin-film transistor TFT may include the semiconductor layer Act, the gate electrode GE, a source electrode SE, and/or a drain electrode DE (e.g., an electrode layer).

In an embodiment, the thin-film transistor TFT shown in FIG. 9 may correspond to the driving thin-film transistor described with reference to FIG. 2. The data line DL of the pixel circuit PC may be electrically connected to the switching thin-film transistor of the pixel circuit PC (e.g., see FIG. 2). In the embodiment shown in FIG. 9, the gate electrode GE is illustrated as a top-gate electrode arranged over the semiconductor layer Act and having a gate insulating layer 203 therebetween. However, the present disclosure is not limited thereto, and in another embodiment, the thin-film transistor TFT may be a bottom-gate transistor.

In an embodiment, the semiconductor layer Act may include polysilicon. In other embodiments, the semiconductor layer Act may include amorphous silicon, an oxide semiconductor, an organic semiconductor, and/or the like. In another embodiment, the pixel circuit PC may include a plurality of semiconductor layers Act. In this case, at least one of the semiconductor layers Act may include polysilicon, and at least one other of the semiconductor layers Act may include an oxide semiconductor.

The gate electrode GE may include a low-resistance metal material. The gate electrode GE may include a conductive material including, for example, Mo, Al, Cu, titanium (Ti), and/or the like. The gate electrode GE may include a single layer or multiple layers including one or more of the above-described materials.

The gate insulating layer 203 is arranged between the semiconductor layer Act and the gate electrode GE, and may include an inorganic insulating material, for example, such as silicon oxide, silicon nitride, silicon oxynitride, aluminum oxide, titanium oxide, tantalum oxide, hafnium oxide, and/or the like. The gate insulating layer 203 may include a single layer or multiple layers including one or more of the materials described above.

The source electrode SE and the drain electrode DE may be connection electrodes electrically connected to the semiconductor layer Act. The source electrode SE and the drain electrode DE may be located on the same layer as that of the data line DL, and may include the same or substantially the same materials as that of the data line DL. The source electrode SE, the drain electrode DE, and the data line DL may include a material having a desired or suitable (e.g., having a good) conductivity. The source electrode SE and the drain electrode DE may include a conductive material including, for example, Mo, Al, Cu, Ti, and/or the like. The source electrode SE and the drain electrode DE may include a single layer or multiple layers including one or more of the above-described materials. In an embodiment, the source electrode SE, the drain electrode DE, and the data line DL may include multiple layers including Ti/Al/Ti.

The storage capacitor Cst may include a lower electrode CE1 and the upper electrode CE2 overlapping with each other and having a first interlayer insulating layer 205 therebetween. The storage capacitor Cst may overlap with the thin-film transistor TFT. For example, FIG. 9 illustrates that the gate electrode GE of the thin-film transistor TFT is the lower electrode CE1 of the storage capacitor Cst. In another embodiment, the storage capacitor Cst may not overlap with the thin-film transistor TFT. The storage capacitor Cst may be covered by a second interlayer insulating layer 207. The upper electrode CE2 of the storage capacitor Cst may include a conductive material including, for example, Mo, Al, Cu, Ti, and/or the like. The upper electrode CE2 may include a single layer or multiple layers including one or more of the above-described materials.

The first interlayer insulating layer 205 and the second interlayer insulating layer 207 may include an inorganic insulating material, for example, such as silicon oxide, silicon nitride, silicon oxynitride, aluminum oxide, titanium oxide, tantalum oxide, hafnium oxide, and/or the like. The first interlayer insulating layer 205 and the second interlayer insulating layer 207 may include a single layer or multiple layers including one or more of the materials described above.

In an embodiment, the thin-film transistor TFT and the storage capacitor Cst may be covered by an inorganic insulating layer. The inorganic insulating layer may prevent or substantially prevent wires and the like including a metal, for example, such as aluminum, that may be damaged by an etchant during a process of manufacturing the display apparatus from being exposed to an etching environment. In this case, the inorganic insulating layer may cover the source electrode SE and the drain electrode DE, and may be arranged between the second interlayer insulating layer 207 and the first organic insulating layer 209.

The inorganic insulating layer may include an inorganic insulating material, for example, such as silicon oxide, silicon nitride, silicon oxynitride, and/or the like, and may include a single layer or multiple layers. In an embodiment, the inorganic insulating layer may include silicon nitride ($SiN_X$). The inorganic insulating layer may have a thickness of about 500 Å. In other embodiments, the inorganic insulating layer may have a thickness of about 1,000 Å or greater, about 1,500 Å or greater, about 2,000 Å or greater, about 2,500 Å or greater, about 3,000 Å or greater, about 3,500 Å or greater, about 4,000 Å or greater, about 4,500 Å or greater, about 5,000 Å or greater, about 5,500 Å or greater, about 6,000 Å or greater, or about 6,500 Å or greater. In another embodiment, the inorganic insulating layer may have a thickness in a range of about 7,000 Å to about 10,000 Å.

The first organic insulating layer 209 may be arranged on the thin-film transistor TFT. The first organic insulating layer 209 may include an approximately flat (e.g., a flat or substantially flat) upper surface.

The pixel circuit PC may be electrically connected to the pixel electrode 221. For example, as shown in FIG. 9, a contact metal layer CM (e.g., a second electrode layer) may be arranged between the thin-film transistor TFT and the pixel electrode 221. The contact metal layer CM may be connected to the thin-film transistor TFT via a contact hole in the first organic insulating layer 209. The pixel electrode 221 may be connected to the contact metal layer CM via a contact hole in the second organic insulating layer 211 on the contact metal layer CM. The contact metal layer CM may include a conductive material including, for example, Mo, Al, Cu, Ti, and/or the like. The contact metal layer CM may include a single layer or multiple layers including one or more of the above-described materials. In an embodiment, the contact metal layer CM may include multiple layers including Ti/Al/Ti.

The first organic insulating layer 209 and the second organic insulating layer 211 may include an organic insulating material, for example, such as a general-purpose polymer such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a combination (e.g., a blend) thereof. In an embodiment, the first organic insulating layer 209 and the second organic insulating layer 211 may include polyimide.

The pixel electrode 211 may be arranged on the second organic insulating layer 211. The pixel electrode 221 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including, for example, Ag, Mg, Al, Pt, Pd, Au, Ni, Nd, Ir, Cr, or a combination (e.g., a compound) thereof. In another embodiment, the pixel electrode 221 may further include a layer including ITO, IZO, ZnO, or $In_2O_3$, which may be above or below the reflective layer described above.

A pixel-defining layer 215 may be arranged on the pixel electrode 221. The pixel-defining layer 215 may include an opening exposing an upper surface of the pixel electrode 221, and may cover an edge of the pixel electrode 221. In an embodiment, the pixel-defining layer 215 may include an organic insulating layer. In another embodiment, the pixel-defining layer 215 may include an inorganic insulating material, for example, such as $SiN_X$, silicon oxynitride (SiON), and/or silicon oxide ($SiO_X$). In another embodiment, the pixel-defining layer 215 may include an organic insulating layer and an inorganic insulating layer.

The intermediate layer 222 includes an emission layer 222b. The intermediate layer 222 may include a first functional layer 222a below the emission layer 222b and/or a second functional layer 222c on the emission layer 222b. The emission layer 222b may include a polymer organic material or a low-molecular weight organic material for emitting light of a desired color.

The first functional layer 222a may include a single layer or multiple layers. For example, when the first functional layer 222a includes a polymer material, the first functional layer 222a may have a single-layered structure including a hole transport layer (HTL), and poly(3,4-ethylene dioxythiophene) (PEDOT) or polyaniline (PANI). When the first functional layer 222a includes a low-molecular weight material, the first functional layer 222a may include a hole injection layer (HIL) and an HTL.

In some embodiments, the second functional layer 222c may be omitted. For example, when the first functional layer 222a and the emission layer 222b include a polymer material, the second functional layer 222c may be included. The second functional layer 222c may include a single layer or multiple layers. The second functional layer 222c may include an electron transport layer (ETL) and/or an electron injection layer (EIL).

The emission layer 222b in the intermediate layer 222 may be arranged at (e.g., in or on) each of the pixels P at (e.g., in or on) the display area DA. The emission layer 222b may be patterned to correspond to the pixel electrode 221. Unlike the emission layer 222b, the first functional layer 222a and/or the second functional layer 222c in the intermediate layer 222 may be formed integrally with the display area DA, and be present at (e.g., in or on) the display area DA as well as the intermediate layer 222.

The opposite electrode 223 may include a conductive material having a low work function. For example, the opposite electrode 223 may include a (semi)transparent layer including, for example, Ag, Mg, Al, Pt, Pd, Au, Ni, Nd, Ir, Cr, Li, Ca, an alloy thereof, or the like. In another embodiment, the opposite electrode 223 may further include a layer including ITO, IZO, ZnO, or $In_2O_3$, which may be on the (semi)transparent layer including one or more of the materials described above. The opposite electrode 223 may be arranged at (e.g., in or on) the intermediate layer 222, as well as at (e.g., in or on) the display area DA. The first functional layer 222a, the second functional layer 222c, and the opposite electrode 223 may be formed by using a thermal deposition method.

The capping layer 230 may be arranged on the opposite electrode 223. For example, the capping layer 230 may include lithium (LiF), and be formed by using the thermal deposition method. However, the present disclosure is not limited thereto, and in another embodiment, the capping layer 230 may be omitted.

A spacer 217 may be arranged on the pixel-defining layer 215. The spacer 217 may include an organic insulating material, for example, such as polyimide. In other embodiments, the spacer 217 may include an inorganic insulating material, or an organic insulating material and an inorganic insulating material.

The spacer 217 may include a material that is different from that of the pixel-defining layer 215, or may include the same or substantially the same material as that of the pixel-defining layer 215. For example, the pixel-defining layer 215 and the spacer 217 may be formed together in a mask process using a halftone mask. In an embodiment, the pixel-defining layer 215 and the spacer 217 may include polyimide.

The organic light-emitting diode OLED may be covered by an encapsulation member. FIG. 9 illustrates that the organic light-emitting diode OLED is covered by the encapsulation member such as the thin-film encapsulation layer 240. However, the present disclosure is not limited thereto. For example, as shown in FIG. 10, the organic light-emitting diode OLED may be obstructed from external air via the encapsulation member such as an upper substrate 500 or a frit.

The thin-film encapsulation layer 240 may include at least one organic encapsulation layer and at least one inorganic encapsulation layer. FIG. 9 shows that the thin-film encapsulation layer 240 includes first and second inorganic encapsulation layers 241 and 243, and an organic encapsulation layer 242 arranged therebetween. In another embodiment, the number of organic encapsulation layers, the number of inorganic encapsulation layers, and a stacking order of the organic encapsulation layers and the inorganic encapsulation layers may be variously modified, as would be known to those skilled in the art.

The first inorganic encapsulation layer 241 and the second inorganic encapsulation layer 243 may include at least one inorganic material selected from among aluminum oxide, titanium oxide, tantalum oxide, hafnium oxide, zinc oxide, silicon oxide, silicon nitride, and silicon oxynitride. The first inorganic encapsulation layer 241 and the second inorganic encapsulation layer 243 may include a single layer or multiple layers including one or more of the materials described above.

The organic encapsulation layer 242 may include a monomer-based material or a polymer-based material. The polymer-based material may include, for example, acrylic-based resin, epoxy-based resin, polyimide, polyethylene, and/or the like. In an embodiment, the organic encapsulation layer 242 may include acrylate.

The first inorganic encapsulation layer 241 may have a thickness different from that of the second inorganic encapsulation layer 243. For example, the first inorganic encapsulation layer 241 may have a thickness greater than that of the second inorganic encapsulation layer 243. However, the present disclosure is not limited thereto, and in other embodiments, the second inorganic encapsulation layer 243 may have a thickness greater than that of the first inorganic encapsulation layer 241, or the first inorganic encapsulation layer 241 and the second inorganic encapsulation layer 243 may have thicknesses that are the same or substantially the same as each other.

Figure 11:
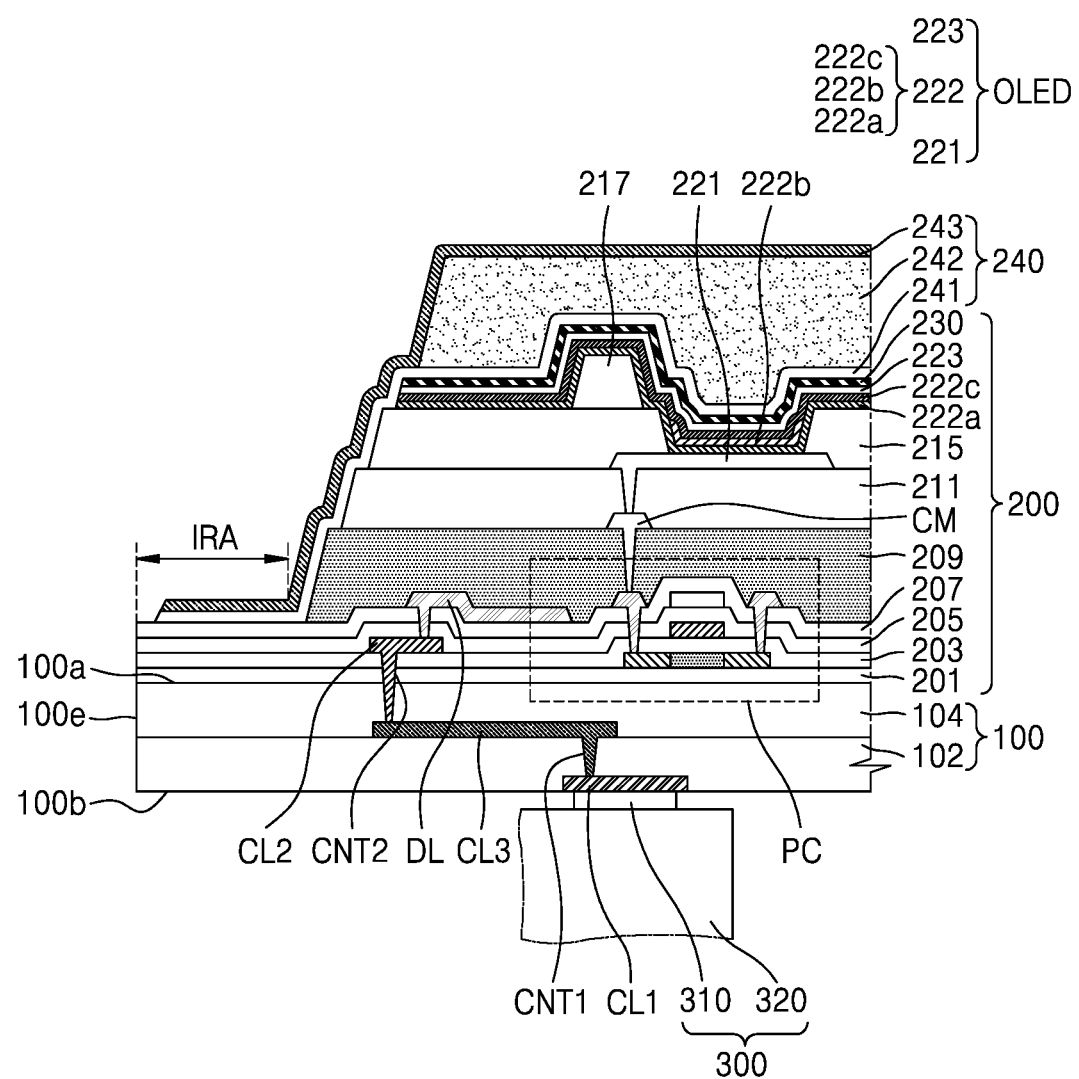
Figure 12:
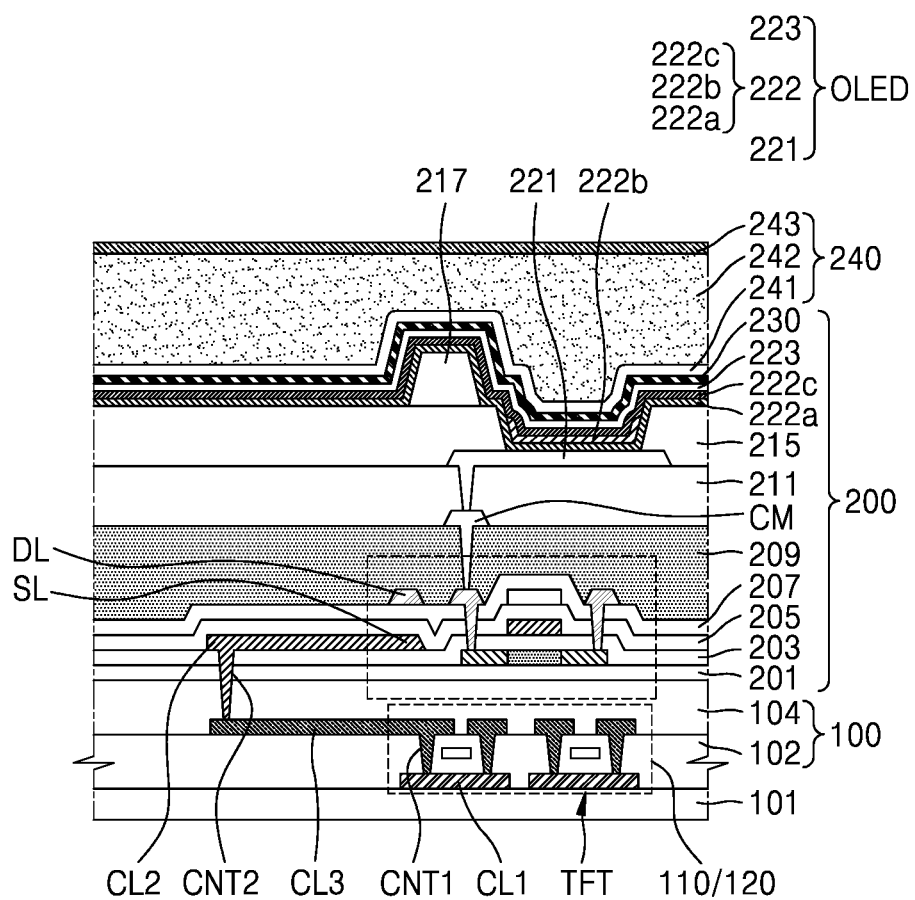

FIGS. 11 and 12 are schematic cross-sectional views of a portion of the display apparatus according to one or more embodiments.

FIGS. 11 and 12 illustrate a structure in which a wire (e.g., a data line DL or a scan line SL) at (e.g., in or on) the display 200 is connected to a pad (e.g., the first conductive pattern CP1) on the second surface 100a (e.g., a rear surface) of the substrate 100 or to a circuit (e.g., the first or second scan driving circuit 110 or 120).

The buffer layer 201 and the gate insulating layer 203 may extend to an edge 100e of the substrate 100. The second conductive pattern CL2 may be located on the gate insulating layer 203. In this case, the second conductive pattern CL2 may include the same or substantially the same material as that of the gate electrode GE. In another embodiment, the second conductive pattern CP2 may be located on the first interlayer insulating layer 205 extending to the inorganic area IRA. In this case, the second conductive pattern CL2 may include the same or substantially the same material as that of the upper electrode CE2 of the storage capacitor Cst. In another embodiment, the second conductive pattern CL2 may include a plurality of conductive lines. In this case, the plurality of conductive lines may include conductive lines including the same or substantially the same material as that of the gate electrode GE, and conductive lines including the same or substantially the same material as that of the upper electrode GE, which may be arranged to alternate with each other.

The second conductive pattern CL2 may be a pattern connected to a signal line or a voltage line included in the pixel circuit PC. In an embodiment, the second conductive pattern CL2 may be connected to the data line DL. The data line DL may be electrically connected to the second conductive pattern CL2 via a contact hole defined in the first and second interlayer insulating layers 205 and 207.

The second conductive pattern CL2 may be connected to the connection pattern CL3 therebelow via the second contact hole CNT2 extending (e.g., passing) through the gate insulating layer 203, the buffer layer 201, and the second base layer 104. The connection pattern CL3 may be connected to the first conductive pattern CP1 via the first contact hole CNT1 extending (e.g., passing) through the first base layer 102.

The second conductive pattern CL2 may be electrically connected to the first conductive pattern CL1 via the connection pattern CL3. In FIG. 11, a side of the connection pattern CP3 may be connected to the second conductive pattern CP2, and another side of the connection pattern CP3 may be connected to the first conductive pattern CL1.

The connection pattern CL3 on the first base layer 102 may have various suitable shapes in a plan view. In one or more embodiments, because the connection pattern CL3 is electrically connected to the data line DL, the connection pattern CL3 may have a fan-out shape in a plan view (e.g., as shown in FIG. 1B).

The electronic structure 300 may be electrically connected to the first conductive pattern CL1 using the conductive material layer 310 as a medium. The electronic structure 300 may include a data driver configured to provide a data signal to each of pixels. In an embodiment, the electronic structure 300 may include the data driver described above, wires for providing a first power voltage and/or a second power voltage, and a circuit structure configured to provide various control signals to the pixels. The electronic structure 300 may have an IC form or an FPCB form.

The conductive material layer 310 may include (e.g., may be) a bump included at (e.g., in or on) the electronic structure 300. For example, a bump at (e.g., in or on) a lower portion of the electronic structure 300 may be in direct contact with the first conductive pattern CL1 to be electrically connected to the first conductive pattern CL1. In another embodiment, the conductive material layer 310 may include (e.g., may be) a conductive adhesive layer, for example, such as an anisotropic conductive film. In this case, the bump at (e.g., in or on) the electronic structure 300 may be in contact with a conductive ball at (e.g., in or on) the conductive material layer 310 that includes an anisotropic conductive film. As the conductive ball is in contact with the first conductive pattern CL1, the electronic structure 300 may be electrically connected to the first conductive pattern CL1.

FIG. 11 illustrates the electronic structure 300 in which the IC including the data driver has a chip form and is electrically connected to the first conductive pattern CL1 via the conductive material layer 310. In this case, the conductive material layer 310 may be a bump of the IC corresponding to a portion of the IC, or an anisotropic conductive film including the conductive ball. The IC may include the data driver described above, as well as the wires configured to apply power voltages, and circuit structures. In another embodiment, the FPCB may be electrically connected to the first conductive pattern CL1 via the conductive material layer 310 including an anisotropic conductive film.

Referring to FIG. 12, the scan line SC included at (e.g., in or on) the display 200 may be electrically connected to the first scan driving circuit 110 (or the second scan driving circuit 120) via the connection pattern CL3. FIG. 12 illustrates an embodiment in which the scan line SL is provided integrally with the second conductive pattern CL2. However, in another embodiment, the scan line SL2 may be connected to the second conductive pattern CL2 provided on a different layer from that of the scan line SL2 via a contact hole.

The second conductive pattern CL2 may be electrically connected to the connection pattern CL3 via the second contact hole CNT2. The connection pattern CL3 may be electrically connected to the first conductive pattern CL1 included in the first scan driving circuit 110 (or the second scan driving circuit 120) via the first contact hole CNT1. In an embodiment, in FIG. 12, the first conductive pattern CL1 may be a semiconductor layer of the thin-film transistor TFT included in the first scan driving circuit 110 (or the second scan driving circuit 120).

As shown in FIG. 12, the first base layer 102 includes the first scan driving circuit 110 and/or the second scan driving circuit 120, and the driving circuit includes the thin-film transistor TFT, and the like. Accordingly, the first base layer 102 may include an inorganic layer and/or an organic/inorganic composite layer, and may include a multi-layered structure.

FIG. 12 illustrates a structure in which the scan line SL is connected to the first scan driving circuit 110 (or the second scan driving circuit 120). However, the structure of FIG. 12 may be also applied to a case where the light-emission control line EL is connected to a light-emission driving circuit. In addition, the conductive layers of the display 200, which may be connected to various circuits and/or wires on the second surface 100b of the substrate 100 as shown in FIG. 1B, may be connected by using one or more methods described with reference to FIG. 4, FIG. 6, FIG. 7, FIG. 11, and/or FIG. 12.

Figure 13:
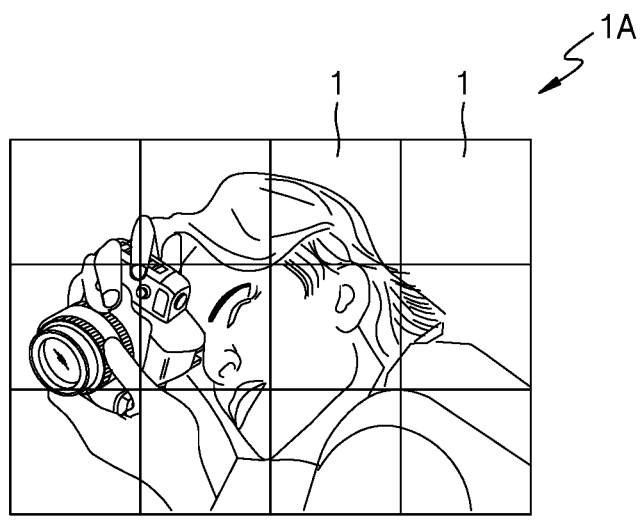
FIG. 13 illustrates an example application of the display apparatus according to an embodiment.

FIG. 13 illustrates an example application of the display apparatus 1 according to an embodiment.

Referring to FIG. 13, a plurality of display apparatuses 1 according to one or more embodiments may be connected to each other to implement a large display apparatus 1A (e.g., a tilted display). As such, when the plurality of display apparatuses 1 are connected to each other, a boundary area (e.g., a non-display area) may be generated at a connection portion. As a comparative example, when a display apparatus includes a display area on a front surface of a substrate and a non-display area outside (e.g., surrounding around a periphery of) the display area on the front surface of the substrate, a width of the non-display area may be shown at (e.g., in or on) a boundary area of the connection portion of the display apparatus. For example, when screens are divided in a large display apparatus, the width of the non-display area may be recognized. Thus, quality of the large display apparatus may deteriorate.

Accordingly, in the display apparatus 1 according to one or more embodiments of the present disclosure, the first conductive pattern CL1 including pads connected to the electronic structure 300 may be arranged on a rear surface (e.g., the second surface 100b) of the substrate 100, and may be electrically connected to the second conductive pattern CL2 including wires extending (e.g., passing) through the substrate 100 and arranged on a front surface (e.g., the first surface 100a) of the substrate 100. Thus, an entirety of the first surface 100a (e.g., the front surface) of the substrate 100 may be the display area DA. In addition, the electronic structure 300 and the pads described above, as well as various driving circuits and wires that may not be arranged at (e.g., in or on) the display area DA, may also be arranged on the second surface 100b (e.g., the rear surface) of the substrate 100 to overlap with the display area DA. Accordingly, an entirety (or substantially an entirety) of the first surface 100a (e.g., the front surface) of the substrate 100 may be implemented as the display area DA to implement a full display.

As described above, according to one or more example embodiments of the present disclosure, a display apparatus in which a peripheral area outside (e.g., surrounding around a periphery of) a display area is reduced, and a method of implementing the display apparatus, are provided. However, the aspects and features of the present disclosure are not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
a substrate comprising a first surface, a second surface opposite the first surface, a display area defined on the first surface, and a non-display area defined on the second surface;
a plurality of display elements at the display area on the first surface of the substrate;
a driving circuit on the second surface and overlapping with the display area of the substrate;
a first conductive pattern on the second surface of the substrate; and
a second conductive pattern on the first surface of the substrate and connected to the first conductive pattern via a contact hole extending through the substrate,
wherein a surface roughness of the second surface of the substrate is greater than a surface roughness of the first surface of the substrate.

2. The display apparatus of claim 1, wherein a material component of the first surface is different from a material component of the second surface.

3. The display apparatus of claim 1, wherein the first conductive pattern is buried within the substrate.

4. The display apparatus of claim 3, wherein:
the first conductive pattern includes a surface, another surface opposite the surface, and a side surface extending between the surface and the other surface to connect the surface to the other surface;
the surface of the first conductive pattern is located on a same plane as that of the first surface of the substrate; and
the other surface and the side surface of the first conductive pattern are in direct contact with the substrate.

5. The display apparatus of claim 1, wherein the substrate comprises a first base layer and a second base layer on the first base layer, and
the display apparatus further comprises a connection pattern arranged between the first base layer and the second base layer, and electrically connecting the first conductive pattern to the second conductive pattern.

6. The display apparatus of claim 5, wherein the first conductive pattern is connected to the connection pattern via a first contact hole in the first base layer, and
the connection pattern is connected to the second conductive pattern via a second contact hole in the second base layer.

7. The display apparatus of claim 1, further comprising an electronic structure on the second surface, and electrically connected to the first conductive pattern to overlap with the display area.

8. The display apparatus of claim 1, further comprising a plurality of first signal lines extending in a first direction and a plurality of second signal lines extending in a second direction crossing the first direction at the display area,
wherein the second conductive pattern is connected to the plurality of first signal lines or the plurality of second signal lines.

9. The display apparatus of claim 8, further comprising a plurality of pixel circuits at the display area, and connected to the plurality of display elements, respectively, each of the plurality of pixel circuits comprising:
a thin-film transistor comprising a semiconductor layer, a gate electrode at least partially overlapping with the semiconductor layer, and an electrode layer connected to the semiconductor layer; and
a storage capacitor comprising a lower electrode corresponding to at least a portion of the gate electrode, and an upper electrode on the lower electrode,
wherein the second conductive pattern comprises a same material as a material of that of at least one selected from among the gate electrode, the electrode layer, the lower electrode, and the upper electrode.

10. The display apparatus of claim 8, wherein the plurality of second signal lines are electrically connected to the driving circuit via the second conductive pattern.

11. The display apparatus of claim 1, further comprising a power supply line on the second surface overlapping with the display area of the substrate.

* * * * *